United States Patent
Seo et al.

(10) Patent No.: US 9,318,673 B2
(45) Date of Patent: Apr. 19, 2016

(54) LIGHT-EMITTING DIODE AND LIGHT-EMITTING DIODE LAMP

(75) Inventors: Noriyoshi Seo, Hiki-gun (JP); Atsushi Matsumura, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 16 days.

(21) Appl. No.: 13/817,226

(22) PCT Filed: Aug. 16, 2011

(86) PCT No.: PCT/JP2011/068563
§ 371 (c)(1),
(2), (4) Date: Feb. 15, 2013

(87) PCT Pub. No.: WO2012/023558
PCT Pub. Date: Feb. 23, 2012

(65) Prior Publication Data
US 2013/0240936 A1    Sep. 19, 2013

(30) Foreign Application Priority Data
Aug. 18, 2010  (JP) .................. 2010-183212

(51) Int. Cl.
*H01L 33/60*   (2010.01)
*H01L 33/30*   (2010.01)
(Continued)

(52) U.S. Cl.
CPC ............ *H01L 33/60* (2013.01); *H01L 33/12* (2013.01); *H01L 33/30* (2013.01); *H01L 33/405* (2013.01);
(Continued)

(58) Field of Classification Search
CPC ..................................................... H01L 33/06
See application file for complete search history.

(56) References Cited

U.S. PATENT DOCUMENTS

2002/0038866 A1   4/2002  Nakatsu et al.
2003/0127658 A1*  7/2003  Sheu et al. ............. 257/79
(Continued)

FOREIGN PATENT DOCUMENTS

CN   101248562 A   8/2008
CN   101257076 A   9/2008
(Continued)

OTHER PUBLICATIONS

Office Action ("Notice of Preliminary Rejection") with a mailing date of Feb. 14, 2014 for corresponding Korean Patent Application No. 10-2013-7003651.
(Continued)

*Primary Examiner* — Mohammad Islam
*Assistant Examiner* — Ratisha Mehta
(74) *Attorney, Agent, or Firm* — Sughrue Mion, PLLC

(57) ABSTRACT

The present invention relates to a light-emitting diode which has an emission wavelength of 655 nm or more, excellent monochromatic properties, high output, high luminance, high efficiency and fast response time, has such a characteristic that the intensity of light emitted from a light extraction surface and traveling in a direction perpendicular to the light extraction surface has high directivity, and can release heat to the outside with high efficiency; and a light-emitting diode lamp. The light-emitting diode includes a compound semiconductor layer (11) which includes at least a pn-junction-type light-emitting section (3) and a strain adjustment layer (13) laminated on the light-emitting section (3); wherein the light-emitting section (3) has a laminated structure composed of a strained light-emitting layer having a composition formula $(Al_XGa_{1-X})_YIn_{1-Y}P$ ($0 \leq X \leq 0.1$, $0.37 \leq Y \leq 0.46$) and a barrier layer, wherein the strain adjustment layer (13) can be penetrated by light from the light-emitting section (3) and has a smaller lattice constant than those of the strained light-emitting layer and the barrier layer; and wherein a functional substrate (5) is bonded to a surface (11b) of the compound semiconductor layer (11) which is located on the opposite side with respect to the light extraction surface (11a) through a reflective structure (4).

17 Claims, 8 Drawing Sheets

(51) Int. Cl.
*H01L 33/40* (2010.01)
*H01L 33/12* (2010.01)
*H01L 33/00* (2010.01)
*H01L 33/64* (2010.01)
*H01L 33/38* (2010.01)

(52) U.S. Cl.
CPC ............ *H01L 33/0079* (2013.01); *H01L 33/38* (2013.01); *H01L 33/641* (2013.01); *H01L 2224/45144* (2013.01); *H01L 2224/48091* (2013.01); *H01L 2224/73265* (2013.01)

(56) References Cited

U.S. PATENT DOCUMENTS

| | | | |
|---|---|---|---|
| 2004/0217692 | A1 | 11/2004 | Cho et al. |
| 2004/0230102 | A1* | 11/2004 | Anderson et al. ............. 600/231 |
| 2006/0255341 | A1* | 11/2006 | Pinnington et al. ............. 257/79 |
| 2007/0076772 | A1* | 4/2007 | Horiguchi et al. ......... 372/43.01 |
| 2008/0093612 | A1 | 4/2008 | Konno et al. |
| 2009/0034569 | A1* | 2/2009 | Tanabe ..................... 372/45.011 |
| 2009/0206359 | A1* | 8/2009 | Nabekura ..................... 257/103 |
| 2009/0206758 | A1* | 8/2009 | Kobilke ....................... 315/113 |
| 2009/0242924 | A1* | 10/2009 | Lin et al. ......................... 257/99 |
| 2009/0272963 | A1 | 11/2009 | Sakamoto et al. |

FOREIGN PATENT DOCUMENTS

| | | |
|---|---|---|
| EP | 0528439 A1 | 2/1993 |
| EP | 1081817 A2 | 3/2001 |
| JP | 9-037648 A | 2/1997 |
| JP | 2000-151024 A | 5/2000 |
| JP | 3230638 B2 | 11/2001 |
| JP | 2002-027831 A | 1/2002 |
| JP | 2002-111053 A | 4/2002 |
| JP | 2002-217450 A | 8/2002 |
| JP | 3373561 B2 | 2/2003 |
| JP | 2004-165486 A | 6/2004 |
| JP | 2004165486 A | 6/2004 |
| JP | 2004-221042 A | 8/2004 |
| JP | 2007-019124 A | 1/2007 |
| JP | 2008-103627 A | 5/2008 |
| WO | 97/40560 A2 | 10/1997 |
| WO | 2008/151255 A1 | 12/2008 |

OTHER PUBLICATIONS

International Search Report for PCT/JP2011/068563 dated Sep. 20, 2011.

Taiwanese Office Action ("Notification for the Opinion of Examination") with a mailing date of Aug. 26, 2013 for Taiwanese Patent Application No. 100129041.

Communication dated Jun. 15, 2015 from the European Patent Office in counterpart application No. 11818199.9.

Communication dated Mar. 11, 2015, issued by the State Intellectual Property Office of the People's Republic of China in counterpart Application No. 201180048839.7.

* cited by examiner

LIGHT-EMITTING DIODE AND LIGHT-EMITTING DIODE LAMP

CROSS REFERENCE TO RELATED APPLICATIONS

This application is a National Stage of International Application No. PCT/JP2011/068563 filed Aug. 16, 2011, claiming priority based on Japanese Patent Application No. 2010-183212, filed Aug. 18, 2010, the contents of all of which are incorporated herein by reference in their entirety.

TECHNICAL FIELD

The present invention relates to a light-emitting diode and a light-emitting diode lamp, and particularly relates to a red light-emitting diode with high power and a light-emitting diode lamp using the same.

BACKGROUND ART

In recent years, plant growth using artificial light sources has been the subject of much research. In particular, cultivation methods using illumination from light-emitting diodes (LED), which exhibit excellent monochromaticity, provide favorable energy conservation and long life and which can be easily miniaturized, have been garnering much attention. Based on the results of research to date, one emission wavelength band that has been confirmed as a suitable light source for plant growth (photosynthesis) is red light having a wavelength within the region from 600 to 700 nm.

In particular, light having a wavelength within the region from 660 to 670 nm is a suitable light source for photosynthesis. Conventional red light-emitting diodes of this wavelength range, having light-emitting layers composed of AlGaAs and InGaNP and the like, have been investigated, however, those has not yet been able to achieve a high output (for example, Patent Documents 1 to 3).

On the other hand, compound semiconductor LEDs having a light-emitting layer composed of an aluminum-gallium-indium phosphide (composition formula: $(Al_XG_{1-X})_YIn_{1-Y}P$, $0 \leq X \leq 1$ and $0 < Y \leq 1$) are also known.

Among these LEDs, a light-emitting layer having the composition $Ga_{0.5}In_{0.5}P$ exhibits the longest wavelength, and the peak wavelength obtained from this light-emitting layer is near 650 nm. Accordingly, in the region of the longer wavelength than 655 nm, it is difficult to achieve practical application and a high brightness.

In general, a light-emitting section having a light-emitting layer composed of $(Al_XGa_{1-X})_YIn_{1-Y}P$ (wherein $0 \leq X \leq 1$ and $0 < Y \leq 1$) is formed on a single crystal substrate gallium arsenide (GaAs) which is optically opaque for light which is emitted from the light-emitting layer and which does not have enough mechanical strength.

Thus, in order to obtain a visible LED with higher luminance, studies for further improving the mechanical strength of the device have been carried out.

It has been disclosed (for example, see Patent Document 4) that after removing the opaque substrate material such as GaAs, a support layer made of a transparent material having increased excellent mechanical strength and being transparent with respect to the emission wavelength was bonded, which is so-called bonding LED technology.

On the other hand, although investigations have been conducted into stained light-emitting layers for laser devices having a different light emission mechanism, there are currently no practical applications of strained light-emitting layers in the field of light-emitting diodes (for example, see Patent Document 5)

Furthermore, investigations are also being pursued into light-emitting sections of light-emitting diodes, which utilize a quantum well structure. However, because the quantum effect obtained by utilizing a quantum well structure shortens the emission wavelength, this effect has been unable to be applied to techniques requiring wavelength lengthening (for example, see Patent Document 6).

Patent Document 1: Japanese Unexamined Patent Application, First Publication No. Hei 9-37648

Patent Document 2: Japanese Unexamined Patent Application, First Publication No. 2002-27831

Patent Document 3: Japanese Unexamined Patent Application, First Publication No. 2004-221042

Patent Document 4: Japanese Patent (Granted) Publication No. 3230638

Patent Document 5: Japanese Unexamined Patent Application, First Publication No. 2000-151024

Patent Document 6: Japanese Patent (Granted) Publication No. 3373561

DISCLOSURE OF INVENTION

In order to put the light-emitting diode lamp to practical applications as a light source for plant growth, it is necessary to reduce the number of LEDs used and the power used by LEDs by using LEDs having high luminous efficiency from the viewpoint of energy conversation and cost.

In particular, for the practical application of LED illumination for plant growth, it is strongly desired to reduce power consumption, to downsize, and to reduce cost. It is strongly desired that the AlGaAs-based LEDs, as a conventional light-emitting diode having a wavelength band of 660 nm, is able to be improved to LEDs having high output, high efficiency, reduced variation in the wavelength, and improved speed.

In addition, lighting method has also been studied to reduce power consumption by using the fast pulse mode, and there is a need for a light-emitting diode having a fast response time. In recent researches on the illumination for plant growth, it was confirmed that energy saving is possible by turning off the light during the photosynthetic reaction time. However, there is a need for a light-emitting diode having a response time to accommodate high-speed pulsed current. More specifically, the response time of the light-emitting diode is preferably 1000 ns or less, and is more preferably 100 ns or less.

However, among the light-emitting layers containing $(Al_XGa_{1-X})_YIn_{1-Y}P$ ($0 \leq X \leq 1$, $0 < Y \leq 1$) with a high luminous efficiency, the composition of the light-emitting layer which is consistent with the lattice constant of the GaAs substrate to be used for epitaxial growth and having the longest wavelength (a small band gap) is $Ga_{0.5}In_{0.5}P$.

The emission wavelength of this light emitting layer is 650 nm. It is not possible to achieve a wavelength longer than 650 nm. In this way, since there is a technical problem in obtaining a light-emitting layer having a wavelength longer than 650 nm, it cannot be put into practical applications and achieve high efficiency. Especially, there is a problem that high power technology has not been established for an LED having a wavelength longer than 655 nm.

Further, in order to improve the luminous efficiency of the light-emitting diode and to increase the utilization efficiency of the light emitted by the LED, it is desirable that the intensity of the light in the direction perpendicular to the light extraction surface be strong, among the light emitted to the outside of the light-emitting diode of the light from the extraction surface.

In addition, in the case of using light-emitting diodes as light sources for plant growth, it is prefer that the heat generated by the light-emitting layer during lighting can be efficiently dissipated to the outside of the light-emitting diode Furthermore, plant growth may be suppressed when using emitted light with a wavelength of 700 nm or more in the illumination for plant growth. Therefore, red light with a wavelength around 660 nm and an excellent monochromatic emission wavelength is desired. Thus, as the illumination for plant growth, an emission spectrum is desirable that emission intensity at 700 nm is less than 10% of the intensity of the peak emission wavelength.

The present invention has been made in view of the above circumstances and relates to a light-emitting diode which has an emission wavelength of 655 nm or more, excellent monochromatic properties, high output, high luminance, high efficiency and a fast response time, which has a characteristic that the intensity of light emitted from a light extraction surface and traveling in a direction perpendicular to the light extraction surface has high directivity, and can release heat to the outside with high efficiency; and to a light-emitting diode lamp. The present invention also relates to a LED lamp which provides suitable illumination for plant growth.

That is, the present invention relates to the following.

(1) A light-emitting diode, including a compound semiconductor layer which includes: a pn junction-type light-emitting section, and a strain adjustment layer laminated on the light-emitting section, wherein the light-emitting section has a laminated structure composed of a strained light-emitting layer having a composition formula $(Al_XGa_{1-X})_YIn_{1-Y}P$ ($0 \leq X \leq 0.1$, $0.37 \leq Y \leq 0.46$) and a barrier layer, the strain adjustment layer is transparent with respect to the emission wavelength, and has a lattice constant smaller than the lattice constant of the strained light-emitting layer and the barrier layer, and a functional substrate is bonded to a surface of the compound semiconductor layer through a reflective structure wherein the surface is located on the opposite side with respect to the light extraction surface.

(2) The light-emitting diode according to (1), wherein the functional substrate is a metal substrate.

(3) The light-emitting diode according to (2), wherein the metal substrate is made of a plurality of stacked metal layers.

(4) The light-emitting diode according to (1), wherein the material of the functional substrate is any one of GaP, Si and Ge.

(5) The light-emitting diode according to any one of (1) to (4), the ratio between the irradiance in a direction forming an angle of 90° with respect to the light extraction surface and the irradiance in a direction forming an angle of 45° with respect to the light extraction surface is at least 1.0 times.

(6) The light-emitting diode according to any one of (1) to (5), wherein the composition formula of the strained light-emitting layer is $Ga_XIn_{1-X}P$ ($0.37 \leq X \leq 0.46$).

(7) The light-emitting diode according to any one of (1) to (6), wherein the thickness of the strained light-emitting layer is within a range of from 8 to 30 nm.

(8) The light-emitting diode according to any one of (1) to (7), wherein the light-emitting section includes 8 to 40 layers of strained light-emitting layers.

(9) The light-emitting diode according to any one of (1) to (8), wherein the composition formula of the barrier layer is $(Al_XGa_{1-X})_YIn_{1-Y}P$ ($0.3 \leq X \leq 0.7$, $0.48 \leq Y \leq 0.52$).

(10) The light-emitting diode according to any one of (1) to (9), the light-emitting section further includes a clad layer on one or both of an upper surface and a lower surface of the laminated structure composed of the strained light-emitting layer and the barrier layer, wherein the composition formula of the clad layer is $(Al_XGa_{1-X})_YIn_{1-Y}P$ ($0.5 \leq X \leq 1$, $0.48 \leq Y \leq 0.52$).

(11) The light-emitting diode according to any one of (1) to (10), wherein the composition formula of the strain adjustment layer is $(Al_XGa_{1-X})_YIn_{1-Y}P$ ($0 \leq X \leq 1$ and $0.6 \leq Y \leq 1$).

(12) The light-emitting diode according to any one of (1) to (10), wherein the composition formula of the strain adjustment layer is $Al_XGa_{1-X}As_{1-Y}P_Y$ ($0 \leq X \leq 1$, $0.6 \leq Y \leq 1$).

(13) The light-emitting diode according to any one of (1) to (12), wherein the strain adjustment layer is made of GaP.

(14) The light-emitting diode according to any one of (1) to (13), wherein the thickness of the strain adjustment layer is within a range of 0.5 to 20 μm.

(15) The light-emitting diode according to any one of (1) to (14), wherein the light extraction surface has a rough surface.

(16) The light-emitting diode according to any one of (1) to (15), which is used for promoting photosynthesis during plant growth, wherein the peak emission wavelength of the strained light-emitting layer is within a range of from 655 to 675 nm.

(17) The light-emitting diode according to (16), wherein the full width at half maximum of the emission spectrum is within the range of 10 to 40 nm.

(18) The light-emitting diode according to (16), wherein the light emission intensity of the strained light-emitting layer at an emission wavelength of 700 nm is less than 10% of the light emission intensity at the peak emission wavelength.

(19) The light-emitting diode according to any one of (1) to (18), wherein the response time (Tr) of the light-emitting section is 100 ns or less.

(20) A light-emitting diode lamp, including a mounting substrate on which a surface of an electrode terminal is formed, and the light-emitting diode according to any one of (1) to (19), wherein the light-emitting diode is mounted on the mounting substrate, and the light-emitting diode is electrically connected to the electrode terminal.

According to one aspect of the present invention, providing a light emitting layer made of a strained light-emitting layer having a composition formula $(Al_XGa_{1-X})_YIn_{1-Y}P$ ($0 \leq X \leq 0.1$, $0.37 \leq Y \leq 0.46$) can improve the efficiency and response time of light emitted from the light-emitting section. Further, by defining the above-mentioned range of the composition of the strained light-emitting layer, a light-emitting diode having an emission wavelength of 655 nm and more can be obtained.

Further, since the strain adjustment layer that can transmit light of the light-emitting section is provided on the light-emitting section, the light from the light-emitting section cannot be absorbed by the strain adjustment layer, and therefore a light-emitting diode with high efficiency and high power can be obtained.

In addition, since the strain adjustment layer has a lattice constant smaller than the lattice constant of the barrier layer, the occurrence of warp of the semiconductor compound layer can be suppressed. Thus, the variation in the amount of strain of the light-emitting layer is reduced, and therefore, the light-emitting diode with excellent monochromatic can be obtained.

In addition, since the reflective structure is provided on the surface of the compound semiconductor layer wherein the surface is located on the opposite side with respect to the light extraction surface, it is possible that within the light emitted from a light extraction surface of the light-emitting section, the intensity of the light traveling in a direction perpendicular to the light extraction surface become higher. Therefore, light-emitting diodes having high brightness and high efficiency can be obtained.

In addition, since the intensity of the light traveling in a direction perpendicular to the light extraction surface become higher, in order to obtain the same intensity of the emitting light in a direction perpendicular to the light extraction surface as the light emitting diode having no reflective structure, a light emitting diode having a reflective structure needs less power consumption than a light emitting diode having no reflective structure.

Further, as the functional substrate which is bonded to a surface of the compound semiconductor layer wherein the surface is located on the opposite side with respect to the light extraction surface through a reflective structure, a substrate with good thermal conductivity can be used. Therefore, through the functional substrate, heat generated by the light-emitting section while emitting can be efficiently released to the outside of the light-emitting diode. In particular, a light-emitting diode having the functional substrate is effective when it is used as illumination for plant growth in which heat generation becomes a problem.

As described above, according to present invention, a light-emitting diode having an emission wavelength of 655 nm or more, excellent monochromatic properties, high output, high luminance, high efficiency and a high response time, as well as excellent heat dissipation, can be provided.

In addition, by using a functional substrate with excellent heat dissipation, heat generated by the light-emitting section while emitting light may be released to the outside of the light-emitting diode.

Further, according to the light-emitting diode of the present invention, as compared with the conventional AlGaAs-based light-emitting diode, a high-power light-emitting diode having a luminous efficiency which is as at least about four times high as that of the conventional one can be obtained In addition, since the functional substrate is bonded to a surface of the compound semiconductor layer wherein the surface is located on the opposite side with respect to the light extraction surface through a reflective structure, the light-emitting diode in which the light intensity in the direction perpendicular to the light extraction surface has a stronger directivity, among the light emitted from light extraction surface, can be provided.

Further, according to the light-emitting diode lamp of the present invention which includes the above-mentioned light-emitting diode, a light-emitting diode lamp for illumination for plant growth can be provided.

EMBODIMENTS FOR CARRYING OUT THE INVENTION

Figure 1:
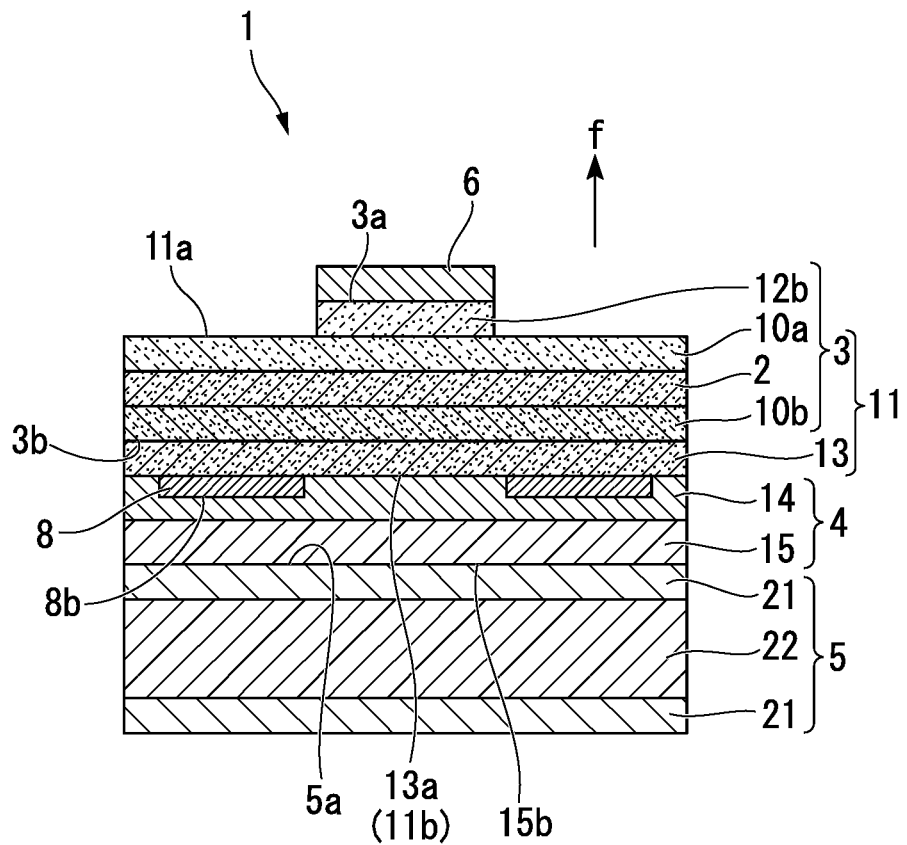
FIG. 1 is a cross-sectional view showing an example of a light-emitting diode according to the first embodiment of the present invention.

Hereinafter, a light-emitting diode related to an embodiment to which the invention is applied, as well as a light-emitting diode lamp using the light-emitting diode, will be described in detail with reference to the drawings. The drawings used in the following description have in some cases been drawn with certain features enlarged, in order to assist with comprehension of those features, and as a result, the dimensional ratios between each of the structural elements in the drawings may not necessarily represent the actual ratios.

The following describes embodiments for carrying out the present invention.

First Embodiment

Light-Emitting Diode

FIG. 1 is a diagram showing an example of a light-emitting diode of the first embodiment of the present invention.

Referring to FIG. 1, the light-emitting diode (LED) 1 of the first embodiment includes: a compound semiconductor layer 11 including at least a light-emitting section 3 made from a light-emitting layer 2 and a strain adjustment layer 13, and a metal layer as a functional substrate 5 which is bonded to the light-emitting section 3 through a reflective structure 4. In addition, a first electrode 6 is provided on the surface 3a of the light-emitting section 3, the surface 3a being on the opposite side with respect to the reflective structure 4. A second electrode 8 is provided through the strain adjustment layer 13 on the surface 3b of the light-emitting section 3, the surface 3b being on the same side as the reflective structure 4.

<Light Emitting Section>

The light-emitting section 3 has a configuration in which at least a p-type lower clad layer 10b, a light-emitting layer 2, and an n-type upper clad layer 10a are sequentially laminated on the strain adjustment layer 13. That is, in order to obtain high-intensity luminescence, it is preferable that the light-emitting section 3 be made to be a so-called double hetero (DH) structure which includes the lower clad layer 10b and the upper clad layer 10a disposed to confront each other on the lower side and the upper side of the light-emitting layer 2 in order to "confine" a carrier leading to radiation recombination, and luminescence in the light-emitting layer 2.

Figure 2:
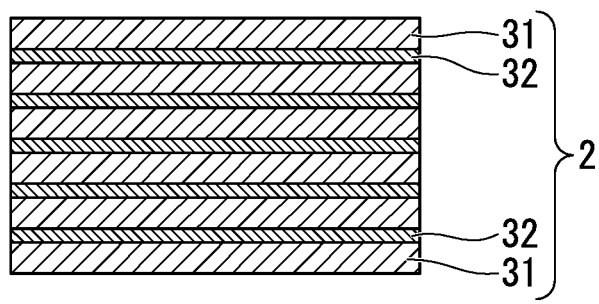
FIG. 2 is an enlarged cross-sectional view which shows the structure of a light-emitting section of a light-emitting diode according to the first embodiment of the present invention.

FIG. 2 is an enlarged cross-sectional view for explaining the structure of a light-emitting section of a light-emitting diode according to the first embodiment of the present invention.

Referring to FIG. 2, it is preferable for the light-emitting layer 2 to include a multilayer structure including a strained light-emitting layer 31 and a barrier layer 32.

The thickness of the light-emitting layer 2 is preferably within a range from 0.02 to 2 μm. Further, there are no particular limitations on the conduction type of the light-emitting layer 2, and an undoped, p-type or n-type unit may be selected. In order to enhance the light emission efficiency, either an undoped unit or a unit having a carrier concentration of less than $3\times10^{17}$ cm$^{-3}$, which offers more favorable crystallinity, is preferred.

It is preferable for the strained light-emitting layer 31 to have a composition formula of $(Al_XGa_{1-X})_YIn_{1-Y}P$ ($0\leq X\leq 1$, $0<Y\leq 1$). In the formula, X is preferably no greater than 0.1, and is more preferably 0. Y is preferably in the range of 0.37 to 0.46, more preferably in the range of from 0.38 to 0.46, and most preferably in the range of from 0.39 to 0.45. By defining the material of the strained light-emitting layer 31 to be within the above range, an emitting light with a wavelength range of 655 to 675 nm can be obtained.

However, in this configuration, since the strained light-emitting layer 31 has a lattice constant different from the other structural part, strain is generated in the compound semiconductor layer 11. Therefore, there is a possibility that adverse effects of crystal defects occur.

The layer thickness of the strained light-emitting layer 31 is in the range of 8 nm or more and 30 nm or less is preferred. When the thickness (thickness of a single layer) of a strained light-emitting layer 31 is less than 6 nm, a quantum effect of the well structure causes a shortening of the emission wavelength, making it impossible to achieve the desired emission wavelength of 655 nm or more.

Accordingly, allowing for fluctuation in the thickness, the thickness of the strained light-emitting layer 31 is preferably at least 8 nm in order to prevent quantum effects. When the thickness is less than 8 nm, an emission wavelength more than 655 nm may not be obtained even if the light-emitting layer 31 has a composition formula in the range of $(Al_XGa_{1-X})_YIn_{1-Y}P$ ($0\leq X\leq 1$, $0<Y\leq 1$). Further, considering the ease of the layer thickness control, the thickness is preferably at least 10 nm. On the other hand, when the layer thickness of the strained light-emitting layer 31 is more than 30 nm, since the amount of strain is too large, crystal defects and surface irregularities tend to occur, and it is therefore not preferable.

The barrier layer 32 has a composition formula of $(Al_XGa_{1-X})_YIn_{1-Y}P$ ($0\leq X\leq 1$, $0<Y\leq 1$) of. The above-mentioned X is preferably in the range of 0.3 to 0.7, more preferably X in the range of 0.4 to 0.6. The above-mentioned Y is preferably in the range of 0.48 to 0.52, and more preferably in the range of 0.49 to 0.51. In addition, the lattice constant of the barrier layer 32 may be equal to or smaller than that of the GaAs substrate.

The thickness of a barrier layer 32 is preferably greater than the thickness of the strained light-emitting layer 31. This enables the light emission efficiency of the strained light-emitting layers 31 to be increased. In addition, it is necessary for the barrier layer 32 to adjust the strain occurring in the strained light-emitting layer 31 while optimizing the luminous efficiency.

Therefore, the barrier layer 32 at least, preferably has a thickness of 15 nm or more, and more preferably has a thickness of 20 nm or more. On the other hand, when the layer thickness of the barrier layer 32 is more than 50 nm, since it is near the wavelength of emission wavelength, optical effects such as light interference or a Bragg reflection, appear.

Therefore, the barrier layer 32 preferably has a layer thickness of 50 nm or less, and more preferably has a layer thickness of 40 nm or less.

As described above, when the layer thickness of the strained light-emitting layer 31 is thin and the layer thickness of the barrier layer 32 is thick, not only can the strain of the strained light-emitting layer 31 be absorbed by the barrier layer 32, but also the crystal defects of the strained light-emitting layer 31 can be suppressed.

In the multilayer structure composed of the strained light-emitting layers 31 and the barrier layers 32, there are no particular limitations on the number of alternately stacked pairs of layers in which each pair is composed of a strained light-emitting layer 31 and a barrier layer 32, but at least 8 pairs and not more than 40 pairs are preferable. In other words, the light-emitting layer 2 preferably includes 8 to 40 layers of strained light-emitting layers 31.

In order to achieving favorable light emission efficiency for the light-emitting layer 2, at least 8 layers of strained light-emitting layers 31 are required. On the other hand, because the strained light-emitting layers 31 and the barrier layers 32 have low carrier concentration levels, if the number of pairs of layers is too large, the forward voltage ($V_f$) tends to increase.

Consequently, the number of pairs of layers is preferably not more than 40, and is more preferably 30 or less.

Furthermore, the strain within the strained light-emitting layer 31 is a stress that occurs within the light-emitting layer 2 as a result of the difference in lattice constants between the epitaxial growth substrate (not shown) and the light-emitting layer 2. Accordingly, if the number of alternately stacked pairs of the strained light-emitting layer 31 and the barrier layer 32 exceeds the above range, namely if the number of strained light-emitting layers 31 contained within the light-emitting layer 2 exceeds the above range, then the light-emitting layer 2 is unable to withstand the strain, resulting in generation of crystal defects and occurrence of problems such as a deterioration in the surface state and reduction in the light emission efficiency.

Regarding the light-emitting layer 2 (the light-emitting section 3), by defining the above range of the material of the strained light-emitting layer 31, the peak emission wavelength of the emission spectrum is preferably in the range of 655 to 675 nm. A range from 660 to 670 is more preferable because of the high efficiency of photosynthesis therein. An emission wavelength within this range is known to be an emission wavelength that is suitable as a light source for plant growth (photosynthesis), and that exhibits a high degree of reaction efficiency for photosynthesis.

On the other hand, if light within the long wavelength region of 700 nm or more is used, then a reaction that inhibits plant growth occurs, and therefore the amount of light within this long wavelength region is preferably minimized. Accordingly, in order to achieve efficient plant growth, red light sources which have a strong intensity of light within the wavelength region from 655 to 675 nm which is ideal for promoting photosynthesis, and which includes no light in the long wavelength region of 700 nm or more, are the most preferable.

Furthermore, in order to achieve the desirable red light source described above, full width at half maximum of the emission spectrum must be narrow. On the other hand, when full width at half maximum is too narrow to close to quantization conditions, it tends to increase the possibility of wavelength fluctuations, and as a result, full width at half maximum of emission spectrum is preferably within a range of from 10 to 40 nm.

Moreover, the emission intensity within the emission spectrum at an emission wavelength of 700 nm is preferably less than 10% of the emission intensity at the above-mentioned peak emission wavelength. In addition, the response time (rise time, Tr) of the light-emitting layer 2 is preferably 100 ns or less.

A light-emitting diode 1 containing the light-emitting layer 2 with these types of characteristics can be used favorably as illumination (LED lamp) for promoting photosynthesis during plant growth. Furthermore, in terms of the structure of the light-emitting layer 2, a variety of compositions, thicknesses and number of layers may be selected as long as they have the above characteristics.

As illustrated in FIG. 1, the lower clad layer 10b and the upper clad layer 10a are provided on at least one surface of the light-emitting layer 2. Specifically, the lower clad layer 10b is provided on the lower side of the light-emitting layer 2 and the upper clad layer 10a is provided on the upper side of the light-emitting layer 2.

The material for the lower clad layer 10b and the upper clad layer 10a preferably has a larger band gap than the strained light-emitting layer 31. A material that has a larger band gap than the barrier layer 32 is even more preferred.

Examples of such materials include compounds having a composition represented by $Al_XGa_{1-X}As$ and compounds having a composition represented by $(Al_XGa_{1-X})_YIn_{1-Y}P$ ($0 \leq X \leq 0.1$, $0 < Y \leq 1$). In the case of a compound having a composition represented by $Al_XGa_{1-X}As$, the value of X preferably has a lower limit of at least 0.3, and more preferably of 0.5 or greater. Further, the value of Y is preferably within a range of from 0.48 to 0.52, and more preferably within a range of from 0.49 to 0.51.

The lower clad layer 10b and the upper clad layer 10a have differing polarities. The carrier concentration and thickness of both the lower clad layer 10b and the upper clad layer 10a may be set within conventionally preferred ranges, and these conditions are preferably optimized so as to maximize the light emission efficiency from the light-emitting layer 2. Further, warping of the compound semiconductor layer 11 may also be reduced by controlling the composition of the lower clad layer 10b and the composition of the upper clad layer 10a.

Specifically, as the lower clad layer 10b, a semiconductor material composed of a Mg-doped p-type $(Al_XGa_{1-X})_YIn_{1-Y}P$ ($0.3 \leq X \leq 1$, $0 < Y \leq 1$) is preferred. Further, the carrier concentration is preferably within a range of from $2 \times 10^{17}$ to $2 \times 10^{18}$ cm$^{-3}$, and the thickness is preferably within a range of from 0.5 to 5 μm.

As the upper clad layer 10a, the use of a semiconductor material composed of a Si-doped n-type $(Al_XGa_{1-X})_YIn_{1-Y}P$ ($0.3 \leq X \leq 1$, $0 < Y \leq 1$) is preferred.

Further, the carrier concentration is preferably within a range of from $1 \times 10^{17}$ to $1 \times 10^{18}$ cm$^{-3}$, and the thickness is preferably within a range of from 0.5 to 2 μm. The polarity of the upper clad layer 10a and the lower clad layer 10b may be selected with due consideration of the device structure.

A surface in contact with the contact layer 12b of the upper clad layer 10a is a surface which functions as a light extraction surface 11a and has been roughened (in other words, it includes a rough surface).

In this manner, by roughening the light extraction surface 11a, total reflection in the light extraction surface 11a is suppressed, and the light extraction efficiency can be improved.

Further, an intermediate layer may be provided between the lower clad layer 10b and the light-emitting layer 2, between the light-emitting layer 2 and the upper clad layer 10a, and between the upper clad layer 10a and the strain adjustment layer 13, in order to ensure gradual change of the band discontinuity between the layers. In such cases, each of the intermediate layers is preferably formed from a semiconductor material having a forbidden bandwidth that is midway between that of the two layers.

Furthermore, a contact layer 12b for reducing the contact resistance of the ohmic electrodes is provided on top of the layers of the light emitting section 3.

The other conventional multi-layers including an electric current diffusion layer for achieving planar diffusion of the device drive current across the entire light emitting unit, or in contrast, a current inhibition layer or current constriction layer for restricting the region through which the device drive current is able to flow, may be provided.

<Strain Adjustment Layer>

As illustrated in FIG. 1, the strain adjustment layer 13 is provided beneath the light emitting section 3. This strain adjustment layer 13 is provided for the purpose of alleviating the strain that is produced due to the strained light-emitting layer 31 during epitaxial growth of the compound semiconductor layer 11 on the GaAs substrate (not shown). Further, the strain adjustment layer 13 is transparent to the emission wavelength from the light emitting section 3.

Moreover, the strain adjustment layer 13 has a lattice constant that is smaller than the lattice constants of the strained light-emitting layer 31 and the barrier layer 32. The lattice constant of the strain adjustment layer 13 is also smaller than the lattice constant of the GaAs substrate (not shown in drawings) used during formation of the compound semiconductor layer 11 (namely, formation by epitaxial growth).

More specifically, if the lattice constant of the strain adjustment layer 13 having the composition described below is termed to A, the lattice constant of the barrier layer 32 is termed to B, and the lattice constant of the strained light-emitting layer 31 is termed to C, then these lattice constants satisfy the relationship A<B<C.

As the strain adjustment layer 13, a material having a composition represented by $(Al_XGa_{1-X})_YIn_{1-Y}P$ ($0 \leq X \leq 1$, $0.6 \leq Y \leq 1$) can be used. The value of X varies depending on the device structure of the compound semiconductor layer 11, but because materials having a low Al concentration are chemically stable, X is preferably not more than 0.5, and is most preferably 0.

Further, the lower limit for the value of Y is preferably at least 0.6. When comparison is made between two structures in which the strains in the light-emitting layer 2 (the strained light-emitting layer 31) are the same, a smaller value of Y results in a smaller strain adjustment effect provided by the strain adjustment layer 13.

This means that the thickness of the strain adjustment layer 13 must be increased, resulting in increased time and cost for deposition of the strain adjustment layer 13, and therefore the value of Y is preferably at least 0.6, and is more preferably 0.8 or greater.

Further, a group III-V semiconductor material that is transparent to the emission wavelength and has a composition represented by $Al_XGa_{1-X}As_{1-Y}P_Y$ ($0 \leq X \leq 1$, $0.6 \leq Y \leq 1$) may also be used preferably as the strain adjustment layer 13.

In the case of a strain adjustment layer 13 having this composition, the lattice constant varies depending on the value of Y. Larger values of Y result in a smaller lattice constant. Further, the degree of transparency relative to the emission wavelength is related to the values of both X and Y, and therefore the values of X and Y are typically selected so as to achieve an appropriately transparent material.

Moreover, Mg-doped p-type GaP may also be used as the strain adjustment layer 13. This GaP requires no adjustment of the composition and also exhibits a large strain adjustment effect, and is therefore the most preferred material for the strain adjustment layer 13 in terms of productivity and stability.

The strain adjustment layer 13 has a smaller lattice constant than that of the GaAs substrate (not shown in the drawings) that functions as the epitaxial growth substrate, and therefore has the ability to alleviate fluctuations in the amount of strain incorporated within the strained light-emitting layer 31.

Accordingly, providing the strain adjustment layer 13 has the effects of improving the uniformity of properties such as the emission wavelength, and preventing the occurrence of crystal defects such as cracks. The thickness of the strain adjustment layer 13 is preferably within a range from 0.5 to 20 μm, and is more preferably within a range from 3 to 15 μm. If the thickness is less than 0.5 μm, then the layer thickness is insufficient to alleviate fluctuations in the amount of strain incorporated within the strained light-emitting layer 31, whereas if the thickness exceeds 20 μm, then the growth time becomes overly long, and the associated costs increase undesirably.

Furthermore, by controlling the composition of the strain adjustment layer 13, warping of the compound semiconductor layer 11 can be reduced, and therefore a compound semiconductor layer 11 having a narrow in-plane wavelength distribution can be produced.

Moreover, in the case of structures where a functional substrate and the compound semiconductor layer 11 are bonded together through the reflective structure 4, if the amount of warping of the compound semiconductor layer 11 is large, then problems such as cracking may occur, and therefore it is desirable to minimize warping of the compound semiconductor layer 11.

<First Electrode, Second Electrode>

The first electrode 6 and the second electrode 8 are ohmic electrodes. The shape and arrangement thereof are not particularly limited as long as current can uniformly be diffused in the light-emitting section 3. For example, it is possible to use electrodes with shape in plan view which is circular or rectangular. The electrodes may be arranged as one piece of electrode or in a plurality of grid electrodes.

For example, as the material of the first electrode 6, it is possible to use AuGe or AuSi layers when the contact layer 12b uses an n-type compound semiconductor. When the contact layer 12b uses a p-type compound semiconductor, AuBe or AuZn layers may be used.

Further, in order to prevent oxidation and to improve the connection reliability of wire bonding, a Au layer or the like may be formed on the electrodes.

For example, as the material of the second electrode 8, it is possible to use AuGe or AuSi layers when the strain adjustment layer 13 uses an n-type compound semiconductor. When the strain adjustment layer 13 uses a p-type compound semiconductor, AuBe or AuZn layers may be used.

<Reflective Structure>

Referring to FIG. 1, the reflective structure 4 is formed on a surface 13a of the strain adjustment layer 13 so as to cover the second electrode 8. The reflective structure 4 is formed by sequentially stacking a transparent conductive layer 14 and a reflective layer 15.

In order to cover the second electrode 8, the transparent conductive layer 14 is formed on the surface 13a (the surface of the strain adjustment layer 13 in which the second electrode 8 is formed) of the strain adjustment layer 13. Transparent conductive layer 14 includes ITO layer and IZO layer.

In addition, instead of transparent conductive layer 14, or combination with transparent conductive layer 14, a so-called cold mirror, which utilizes the refractive index difference of transparent materials, may be used together with the reflective layer 15. For example, a multilayer layer of oxidation titanium layer or silicon oxide, white alumina and AlN may be used.

Referring to FIG. 1, the reflective layer 15 is laminated on the transparent conductive layer 14. As the reflective layer 15, for example, a metal such as copper, silver, gold, aluminum or alloy thereof may be used. Since these materials have high reflectance, the reflectance of the reflective layer 15 can be 90% or more.

Since the reflective layer 15 is formed, light emitted from the active layer 11 is reflected in front direction f by the reflective layer 15, and the light extraction efficiency in front direction f can be improved. As a result, a light-emitting diode having higher intensity can be produced.

Here, the front direction f is a direction at an angle of 90° with respect to light extraction surface 11a (3a surface of the light-emitting section 3 in the case of the present embodiment) of the compound semiconductor layer 11, and a direction away from the light-emitting diode 1. In addition, the reflective structure 4 may be composed of only the reflective layer 15 without the transparent conductive layer 14.

In addition, the reflective structure 4 may be formed by adjusting the ratio between the irradiance in a direction forming an angle of 90° with respect to the light extraction surface 11a and the irradiance in a direction forming an angle of 45° with respect to the light extraction surface 11a to at least 1.0 times.

In this manner, since the ratio between the irradiance in a direction forming an angle of 90° with respect to the light extraction surface 11a and the irradiance in a direction (the direction perpendicular to the light extraction surface 11a) forming an angle of 45° with respect to the light extraction surface 11a is at least 1.0 times, light-emitting diode 1 having high luminance and high efficiency can be obtained.

In addition, since the intensity of the light traveling in a direction perpendicular to the light extraction surface 11a is increased, in order to obtain the same intensity of emitting light in a direction perpendicular to the light extraction surface 11a as the light emitting diode having no reflective structure 4, the light emitting diode having the reflective structure 4, power consumption can be reduced to be less than the light emitting diode having no reflective structure.

Figure 3:
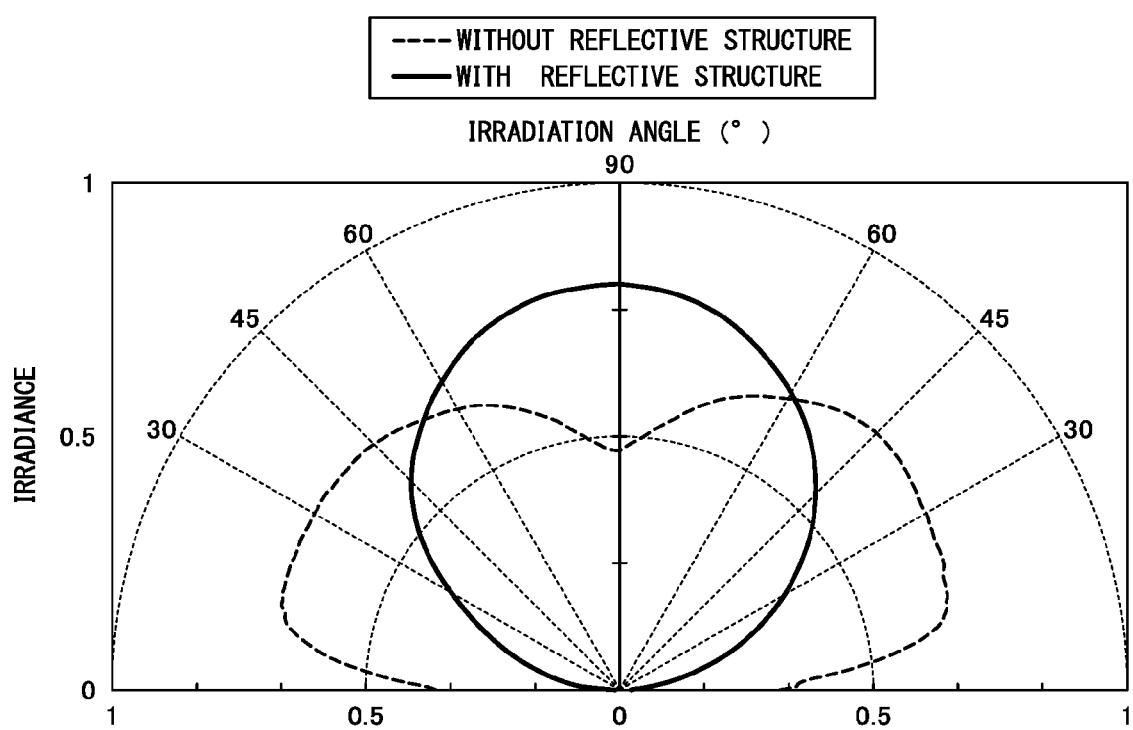
FIG. 3 is a diagram showing the irradiance of a light-emitting diode having a reflective structure and a light-emitting diode having no reflective structure.

FIG. 3 is a diagram showing the irradiance of a light-emitting diode having a reflective structure and of a light-emitting diode having no reflective structure. FIG. 3 shows the irradiance of light emitted from the light extraction surface 11a. Further, in FIG. 3, the irradiation angle in the direction perpendicular to the light extraction surface 11a is set to 90°, and the irradiation angle in a direction parallel to the light extraction surface 11a is set to 0°.

Referring to FIG. 3, it is confirmed that in a light-emitting diode without the reflective structure 4, irradiance in an oblique direction (in particular, the emitting directions having angles of 15 to 55)° is greater, but irradiance decreases as the direction approaches the emitting angle of 60° to 90°.

On the other hand, it is confirmed that in the light-emitting diode 1 with the reflective structure 4, irradiance at the emitting angle 60° or less is smaller than the light-emitting diode without the reflective structure 4, however, irradiance at the emitting angle range of 60 to 90° is greater than the light-emitting diode without the reflective structure 4.

Thus, it is be confirmed that by providing the reflective structure 4, the irradiance of emitting light can become stronger at the direction having an angle of 90° with respect to the light extraction surface 11a.

More specifically, as the reflective layer 15, it is possible to use a laminated layer consisting of, from the side of the transparent conductive layer 14, a Ag alloy layer, a W layer, a Pt layer, a Au layer, and a bonding metal layer. As the bonding metal layer which is formed on the surface 15b of the reflective layer 15, the surface 15b being located on the opposite side with respect to the surface to which the transparent conductive layer 14 is contacted, a metal which has a low electrical resistance and which can be melted at a low temperature may be used. By using the above-mentioned bonding metal, the functional substrate can be bonded without giving thermal stress to the compound semiconductor layer 11.

As the bonding metal, a Au-typed eutectic metal having a low melting point and having chemical stability may be used. As a Au-typed eutectic metal, for example, an eutectic composition (as Au-typed eutectic metal) of an alloy such as AuSn, AuGe, AuSi may be used.

In addition, it is preferable to add a metal such as titanium, chromium, or tungsten to the bonding metal. As a result, the metal such as titanium, chromium, or tungsten can prevent, as a barrier metal, impurities in the metal substrate from diffusing into the reflective layer 15 and depressing the reaction.

<Functional Substrate (Metal Substrate)>

Referring to FIG. 1, the functional substrate 5 is bonded through the reflective structure 4 on the 11b surface (specifically, 13a surface of the strain adjustment layer 13) of the compound semiconductor layer 11. Specifically, the bonding surface 5a of the functional substrate 5 is bonded to the surface 15b of the reflective structure 4 wherein the surface 15b is located on the opposite side with respect to the surface facing the light-emitting section 3 in the reflective structure 4.

In the first embodiment, the metal substrate is used as a functional substrate 5. In other words, in the first embodiment, the metal substrate is bonded through the reflective structure 4 on the 11b surface (specifically, surface 13a of the strain adjustment layer 13) of the compound semiconductor layer 11. The following example uses the metal substrate as the functional substrate 5.

As the functional substrate 5, a plural metal layers may be used. It is preferable that two kinds of metal layers are laminated alternately to form a metal substrate. Particularly, it is preferable that the number of layers of these two kinds of metal layers be an odd number.

In this case, from the viewpoint of reducing warping and cracking of the metal substrate, when a second metal layer 22 uses a material having a smaller coefficient of thermal expansion than that of the compound semiconductor layer 11, it is preferable that a first metal layer 21 use a material having a larger coefficient of thermal expansion than that of the compound semiconductor layer 11.

Since the coefficient of thermal expansion of the whole functional substrate 5 is similar to the coefficient of thermal expansion of the compound semiconductor layer, warping and cracking of the functional substrate 5 when bonding the compound semiconductor layer can be repressed. As a result, the manufacturing yield of the light-emitting diode can be improved When the second metal layer 22 uses a material having larger coefficient of thermal expansion than that of compound semiconductor layer 11, it is preferable that the first metal layer 21 use a material having a smaller coefficient of thermal expansion than that of compound semiconductor layer 11.

Since the coefficient of thermal expansion of the whole functional substrate 5 is similar to the coefficient of thermal expansion of the compound semiconductor layer, warping and cracking of the functional substrate 5 when bonding the compound semiconductor layer can be repressed. As a result, the manufacturing yield of the light-emitting diode 1 can be improved.

As described above, the positions of the first and second metal layers 21 and 22 constituting functional substrate 5 can be replaced. That is, in FIG. 1, the functional substrate 5 is formed by sandwiching one layer of the second metal layer 22 between two layers of the first metal layer 21; however, the functional substrate 5 (metal substrate) may be formed by sandwiching one layer of the first metal layer 21 between two layers of the second metal layer 22.

As the functional substrate 5 including the first and the second metal layers 21 and 22, for example, a combination between a metal layer made from silver (coefficient of thermal expansion=18.9 ppm/K), copper (coefficient of thermal expansion=16.5 ppm/K) gold (coefficient of thermal expansion=14.2 ppm/K), aluminum (coefficient of thermal expansion=23.1 ppm/K), nickel (coefficient of thermal expansion=13.4 ppm/K), or an alloy thereof; and a metal layer made from molybdenum (coefficient of thermal expansion=5.1 ppm/K), tungsten (coefficient of thermal expansion=4.3 ppm/K), chromium (coefficient of thermal expansion=4.9 ppm/K), or an alloy thereof can be used.

A functional substrate 5 (metal substrate) having three layers of Cu/Mo/Cu is preferable. From the above viewpoint, a similar effect is provided with a metal substrate having three layers of Mo/Cu/Mo.

However, since a metal substrate having three layers of Cu/Mo/Cu has a structure in which Mo having strong mechanical strength is surround by Cu which is easy to process, it is easier to process than a metal substrate having three layers of Mo/Cu/Mo.

The coefficient of thermal expansion of the whole functional substrate 5 which is, a functional substrate 5 having three layers of Cu (30 μm)/Mo (25 μm)/Cu (30 μm) is 6.1 ppm/K, for example, while that of a functional substrate 5 having three layers of Mo (25 μm), Cu (70 μm), and Mo (25 μm) is 5.7 ppm/K, In addition, from the viewpoint of heat dissipation, it is preferable that a metal layer of the functional substrate 5 be made from materials having high heat-conductivity. As a result, since the heat dissipation ability of functional substrate 5 is improved, not only can a light-emitting diode which can emit light with high brightness be obtained, but also a light-emitting diode having a long lifetime.

For example, it is preferable that silver (heat-conductivity=420 W/m·K), copper (heat-conductivity=398 W/m·K), gold (heat-conductivity=320 W/m·K), aluminium (heat-conductivity=236 W/m·K), molybdenum (heat-conductivity=138 W/m·K), tungsten (heat-conductivity=174 W/m·K), or an alloy thereof be used.

It is more preferable that the coefficient of thermal expansion of the materials of the functional substrate 5 be approximately equal to the coefficient of thermal expansion of the compound semiconductor layer 11.

It is particularly preferable that the material of the functional substrate 5 have a coefficient of thermal expansion which is within ±1.5 ppm/K of the coefficient of thermal expansion of the compound semiconductor layer 11. Since the stress, which is generated by heat when functional substrate 5 is bonded with the compound semiconductor layer, on the light-emitting section 3 can be lowered, cracks in the functional substrate 5, which are generated by heat when the compound semiconductor layer is bonded, can be repressed. As a result, the manufacturing yield of the light-emitting diode can be improved.

As for the heat-conductivity of the whole functional substrate 5, for example, the heat-conductivity of a functional substrate 5 having three layers of Cu (30 μm), Mo (25 μm), and Cu (30 μm) is 250 W/m·K.

As for the heat-conductivity of the whole functional substrate 5, for example, the heat-conductivity of a functional substrate 5 having three layers of Mo (25 μm), Cu (70 μm), and Mo (25 μm) is 220 W/m·K.

The thickness of the functional substrate 5 made of a metal substrate is preferably 50 μm or more and 150 μm or less.

When the thickness of the functional substrate 5 is thicker than 150 μm, the cost of manufacturing the light-emitting diode is increased, which is not preferable. Further, when the thickness of the functional substrate 5 is thinner than 50 μm, there is a possibility that cracking, lacking or warping may easily occur during handling. It reduces the yield of light-emitting diodes.

The number of layers of the first metal layer 21 and the second metal layer 22 included in one functional substrate 5 is preferably 3 to 9, or is more preferably 3 to 5.

When the number of layers of the first metal layer 21 and the second metal layer 22 is two, there is a possibility of thermal expansion in the thickness direction being unbalanced, and of cracking of the functional substrate 5 occurring. Conversely, when the number of layers of the first metal layer 21 and the second metal layer 22 is more than nine, it is necessary for each of the first metal layer 21 and the second metal layer 22 to become thinner.

However, since it is very difficult to reduce the thickness of the first metal layer 21 and the second metal layer 22; when a single metal layer is prepared by reducing the thickness of the first metal layer 21 and the second metal layer 22, the thickness of each layer becomes non-uniform, and therefore, the characteristics of the obtained light-emitting diodes may vary.

In addition, when a single-layer metal substrate is formed by reducing the thickness of a layer, cracking of the substrate may occur easily.

In the case of using a thin single-layer metal substrate, since it is difficult to manufacture the metal substrate, the manufacturing cost of the light-emitting diode may increase.

An auxiliary bonding layer for stabilizing the electrical contact and the eutectic metal for die bonding may be formed on the bonding surface 5a of the functional substrate 5. Thus, the bonding process can be easily carried out. As the auxiliary bonding layer, a layer of, for example, Au or AuSn can be used.

The method of bonding a functional substrate 5 to the light-emitting section 3 is not limited to the method described above. For example, conventional techniques such as diffusion bonding, adhesives, and bonding method at room temperature may be used.

According to the first embodiment, the light-emitting diode 1 includes at least a compound semiconductor layer 11 having a pn junction light-emitting section 3 and a strain adjustment layer 13 formed on the light-emitting section 3. Since the light-emitting section 3 is made of a buffer layer 32 and a strained light-emitting layer 31 having a composition formula $(Al_XGa_{1-X})_YIn_{1-Y}P$ ($0 \leq X \leq 0.1$, $0.37 \leq Y \leq 0.46$), the efficiency and response time of light emitted from the light-emitting section 3 can be improved.

Further, by defining the above-mentioned range of the composition of the strained light-emitting layer 31, a light-emitting diode 1 having an emission wavelength of 655 nm or more can be obtained.

Further, since the strain adjustment layer 13 that can transmit light of the light-emitting section 3 is provided on the light-emitting section 3, light from the light-emitting section 3 cannot be absorbed by the strain adjustment layer, and therefore a light-emitting diode with high efficiency and high power can be obtained.

In addition, since the strain adjustment layer 13 has a lattice constant smaller than the lattice constant of the strained light-emitting layer 31 and the barrier layer 32, the occurrence of warp of the semiconductor compound layer 11 can be suppressed. Thus, the variation in the amount of strain on the strained light-emitting layer 31 is reduced, and therefore, a light-emitting diode 1 with excellent monochromatic can be obtained.

In addition, since the reflective structure 4 is provided on the surface 11b of the compound semiconductor layer 11, the surface 11b being located on the opposite side with respect to the light extraction surface 11a, it is possible that in the light emitted from a light extraction surface 11a of the compound semiconductor layer 11, the intensity of the light traveling in a direction (specifically, the front direction f) perpendicular to the light extraction surface 11a increases. Therefore, a light-emitting diode 1 having high brightness and high efficiency can be obtained.

In addition, since the intensity of the light traveling in a direction perpendicular to the light extraction surface 11a increases, in order to obtain the same intensity of light emitted in a direction perpendicular to the light extraction surface 11a as in the light emitting diode having no reflective structure 4, the light emitting diode 1 having the reflective structure 4 need to consume less power than the light emitting diode having no reflective structure 4.

Further, since the functional substrate 5 which is bonded to a surface 11b of the compound semiconductor layer 11, the surface 11b being located on the opposite side with respect to the light extraction surface 11a through a reflective structure 4 is used, through the functional substrate 5, heat generated by the light-emitting section 3 while emitting light can be efficiently released to the outside of the light-emitting diode 1.

In addition, a substrate with good thermal conductivity can be used.

Furthermore, by constituting the functional substrate 5 with the first and second metal layers 21 and 22 having thermal conductivity of at least 130 W/m·K, since the heat dissipation of functional substrate 5 increases, not only does the light-emitting diode 1 emit light with higher luminance, but also the life of the light-emitting diode 1 is increased.

In addition, when a substrate which can transmits light is used as the functional substrate 5 to be bonded by Ar beam, since the bonding surface is high resistance, it is difficult for current to flow to the substrate side. However, when the metal substrate is used as the functional substrate 5 to be bonded by using eutectic metal, it is possible to produce one wire structure.

That is, according to the light-emitting diode of the first embodiment, the light-emitting diode 1 which has an emission wavelength of 655 nm or more, excellent monochromatic properties, high output, high luminance, high efficiency and high response speed, and has such a characteristic that the intensity of light emitted from a light extraction surface and traveling in a direction perpendicular to the light extraction surface has high directivity, and can release heat to the outside with high efficiency can be obtained.

<Method of Manufacturing a Light-Emitting Diode>

The following describes a method of manufacturing the light-emitting diode 1 of the first embodiment.

The method of manufacturing the light-emitting diode 1 of the first embodiment includes steps of forming a functional substrate 5, then forming the light-emitting section 3 having a light-emitting layer 2 through contact layer 12b on a semiconductor substrate 33, forming a second electrode 8 on the surface of the light-emitting section 3 wherein the surface is an opposite side with respect to the semiconductor substrate 33, forming a reflective structure 4 through the second electrode 8 on the surface of the light-emitting section 3 wherein the surface is an opposite side with respect to the semiconductor substrate 33, bonding the functional substrate 5 through the reflective structure 4 with the light-emitting section 3, removing the semiconductor substrate 33 and a portion of the contact layer 12b, and forming a first electrode 6 on the surface of light-emitting section 3 wherein the surface is the opposite side of light-emitting section 3 with respect to functional substrate 5.

FIGS. 4A to 10 are cross-sectional views showing a manufacturing process of a light-emitting diode according to the first embodiment of the present invention. In FIGS. 4A to 10, the same elements as those of the light-emitting diode 1 which is shown in FIG. 1 have the same reference numerals.

Referring to FIG. 4A to FIG. 10, the method for manufacturing a light-emitting diode of the first embodiment is described. Firstly, the process of manufacturing the functional substrate 5 is described.

<Process of Manufacturing Functional Substrate>

Figure 4A:
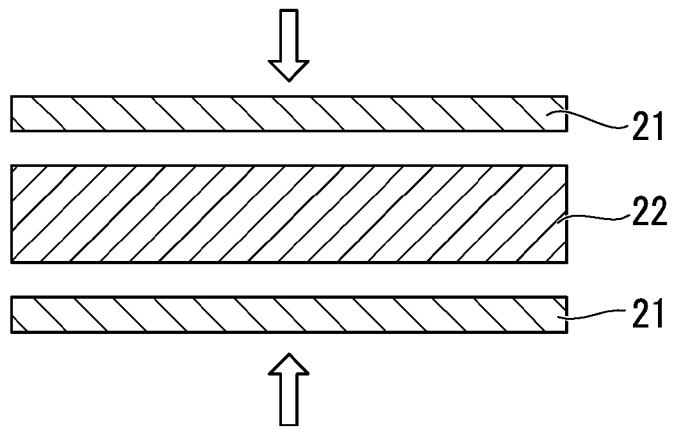
FIG. 4A is a cross-sectional view (1) showing a manufacturing process of a light-emitting diode according to the first embodiment of the present invention, which is a diagram showing a state in which the first and second metal layers are oppositely disposed.
Figure 4B:
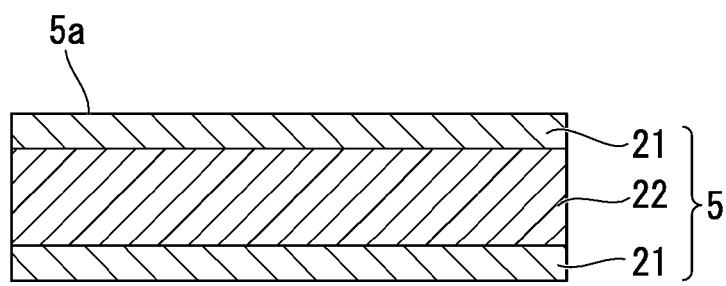
FIG. 4B is a cross-sectional view (1) showing a manufacturing process of a light-emitting diode according to the first embodiment of the present invention, showing the first and second metal layers being bonded, and then a functional substrate made of the first and second metal layers being formed.

As shown in FIGS. 4A and 4B, the functional substrate 5 is formed by hot pressing the first and second metal layers 21 and 22 which have a thermal conductivity of 130 W/m·K or more.

Specifically, two pieces of the first metal layer 21 with substantially slab shape and one piece of the second metal layer 22 with substantially slab shape are prepared. For example, a Cu layer having a thickness of 30 µm is used as the first metal layer 21, and a Mo layer having a thickness of 25 µm is used as the second metal layer 22.

Next, as shown in FIG. 4A, one layer of the second metal layer 22 is inserted between two layers of the first metal layer 21.

Then, in the device with a predetermined pressure, the multi-layer plate including the first metal layer 21 and the second metal layer 22 are placed, and then at high temperatures, the first metal layer 21 and the second metal layer 22 are bonded by applying a load along the direction of the arrow (see FIG. 4A).

Thus, as shown in FIG. 4B, the first metal layer 21 is a Cu layer, the second metal layer 22 is a Mo layer. A functional substrate 5 is made of three layers of Cu (30 µm)/Mo layer (25 µm)/Cu (30 µm). The thermal expansion coefficient of the functional substrate 5 described above is 6.1 ppm/K, and the thermal conductivity is 250 W/m·K.

Then, after it is cut to fit the size of the bonding surface (wafer) of light-emitting portion 3, the surface may be treated to obtain a mirror-finished surface.

In addition, an auxiliary layer may be formed on the bonding surface 5a of the functional substrate 5 to stabilize the electrical contact. As the bonding auxiliary layer, a gold layer, a platinum layer, or a nickel layer may be used. For example, after a 0.1 µm nickel layer is deposited, a 0.5 µm gold layer is deposited on the nickel layer.

Furthermore, instead of the above-mentioned bonding auxiliary layer, an eutectic metal layer for die bonding, such as AuSn, may be formed. Thus, the bonding process may become simple.

<Process of Forming the Light-Emitting Section and Second Electrode>

Figure 5:
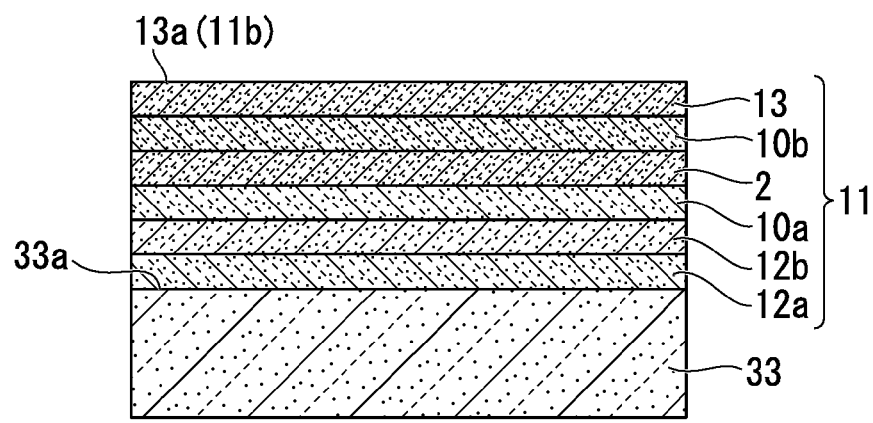
FIG. 5 is a cross-sectional view (2) showing a manufacturing process of a light-emitting diode according to the first embodiment of the present invention.

Firstly, as shown in FIG. 5, on the surface 33a of the semiconductor substrate 33, a compound semiconductor layer 11 is formed by growing a plurality of epitaxial layers. In this stage, contact layer 12b constituting the compound semiconductor layer 11 is not patterned.

The semiconductor substrate 33 is a substrate for forming a compound semiconductor layer 11, and, for example, is a Si-doped n-type GaAs single crystal substrate which surface 33a is a plane tilted 15° from the surface (100). Thus, when the AlGaInP layer or AlGaAs layer are used as the compound semiconductor layer 11, as a substrate for forming the compound semiconductor layer 11, a single crystal gallium arsenide (GaAs) substrate may be used.

The compound semiconductor layer 11 is made by sequentially laminating a buffer layer 12a made of GaAs, an etching stopper layer (not shown) provided in order to be used for selective etching, a contact layer 12b made of Si-doped n-type AlGaInP, the n-type upper clad layer 10b, the light-emitting layer 2, the p-type lower clad layer 10b, and the strain adjustment layer 13 made of a Mg-doped p-type GaP, on a GaAs substrate as a semiconductor substrate 33.

As the GaAs substrate, a commercially available single-crystal substrate manufactured by a known manufacturing method can be used. It is preferable that the epitaxially grown surface of the GaAs substrate be smooth. With respect to the plane orientation of the surface of the GaAs substrate, a substrate in which epitaxial growth is easy and mass-produced and which has a (100) plane and a plane deviated within ±20° from (100) is preferable in terms of stability of quality.

Further, it is more preferable that a range of the plane orientation of the GaAs substrate be 15°±5° deviated in a (0-1-1) direction from a (100) direction.

It is preferable that the dislocation density of the GaAs substrate be low in order to improve the crystallinity of the compound semiconductor layer 11. Specifically, the dislocation density is, for example, 10000 pieces $cm^{-2}$ or less, and is preferably 1000 pieces $cm^{-2}$ or less.

The GaAs substrate may also be any of an n-type and a p-type. The carrier concentration of the GaAs substrate can be appropriately selected for a desired electric conductivity and an element structure.

For example, in a case where the GaAs substrate is a silicon-doped p-type substrate, it is preferable that the carrier concentration be in a range of from $1\times10^{17}$ $cm^{-3}$ to $5\times10^{18}$ $cm^{-3}$. In contrast, in a case where the GaAs substrate is a zinc-doped p-type substrate, it is preferable that the carrier concentration be in a range of from $2\times10^{18}$ $cm^{-3}$ to $5\times10^{19}$ $cm^{-3}$.

The thickness of the GaAs substrate may be in an appropriate range according to the size of the substrate. It may be broken during the manufacturing process of a compound semiconductor layer 11, if the thickness of GaAs substrate is below an appropriate range.

On the other hand, material costs rise if the thickness of the GaAs substrate is above an appropriate range. Therefore, when substrate size of GaAs substrate is large, for example, in the case of the diameter of 75 mm, thickness of 250-500 μm is preferable to preclude the formation of cracks during handling.

In the case of a diameter of 50 mm, a thickness of 200-400 μm is preferable, and a thickness of 350-600 μm is preferable in the case of a diameter of 100 mm.

Since the thickness of substrate is increased depending on substrate size of GaAs substrate, warping of compound semiconductor layer 11 can be reduced. As a result, distribution of temperature in epitaxial growth becomes homogeneous, and then the in-plane wavelength distribution of light-emitting layer 2 can be decreased. In addition, the shape of the GaAs substrate may be a rectangle, and is not limited to a circle in particular.

The buffer layer 12a is provided in order to reduce lattice mismatch between the semiconductor substrate 33 and the constitution layer of the light-emitting section 3. Therefore, if the quality of a substrate or an epitaxial growth condition is selected, the buffer layer 12a is not necessarily required.

Further, it is preferable that the material of the buffer layer 12a be the same material as that of the substrate which is subjected to epitaxial growth. Therefore, in this embodiment, as the buffer layer 12a, it is preferable to use GaAs like the GaAs substrate.

Further, as the buffer layer 12a, in order to reduce the propagation of a defect, a multilayer layer made of a material different from the GaAs substrate can also be used. It is preferable that the thickness of the buffer layer 12a be 0.1 μm or more and more preferably that it be 0.2 μm or more.

The contact layer 12b is provided in order to lower the contact resistance with an electrode. It is preferable that the material of the contact layer 12b be a material which has a larger bond gap than that of the strained light-emitting layer 31, and $Al_XGa_{1-X}As$, $(Al_XGa_{1-X})_YIn_{1-Y}P$ ($0 \leq X \leq 1$, $0 < Y \leq 1$) is preferable.

Further, it is preferable that the lower limit of the carrier concentration of the contact layer 12b be $5 \times 10^{17}$ cm$^{-3}$ or more in order to lower the contact resistance with an electrode, and $1 \times 10^{18}$ cm$^{-3}$ or more is more preferable.

It is preferable that the upper limit of the carrier concentration be $2 \times 10^{19}$ cm$^{-3}$ or less where the lowering of crystallinity easily occurs. With respect to the thickness of the contact layer 12b, 0.5 μm or more is preferable and 1 μm or more is preferred. The upper limitation of the thickness is not limited particularly, and 5 um or less is preferable when the cost of the epitaxial growing process is taken into consideration.

In this embodiment, it is possible to apply a known growth method such as a molecular beam epitaxial method (MBE) or a low-pressure metal-organic chemical vapor deposition method (an MOCVD method).

In particular, it is preferable to apply the MOCVD method having excellent mass-productivity. Specifically, in the GaAs substrate (semiconductor substrate 33) which is used for the epitaxial growth of the compound semiconductor layer 11, it is preferable to remove contamination from the surface or a natural oxide layer by carrying out a pretreatment such as a cleaning process or a thermal treatment before the growth.

Each layer which is included in the above compounds semiconductor layer 11 is formed by setting the GaAs substrate of a diameter of 50-150 mm in MOCVD apparatus, and then making them grow up epitaxially. In addition, as a MOCVD apparatus, a commercial large-scale apparatus such as a planetary apparatus or a high-speed rotary-type apparatus can be used.

When each layer of the compound semiconductor layer 11 is epitaxially grown, as a raw material of a group III constituent element, for example, trimethyl aluminum (($CH_3$)$_3$Al), trimethylgallium (($CH_3$)$_3$Ga), and trimethylindium (($CH_3$)$_3$In) can be used.

Further, as a doping material of Mg, for example, bis-cyclopentadienyl magnesium (bis-($C_5H_5$)$_2$Mg) or the like can be used. Further, as a doping material of Si, for example, disilane ($Si_2H_6$) or the like can be used.

Further, as a raw material of a group V constituent element, phosphine (PH$_3$), arsine (AsH$_3$), or the like can be used. Further, as the growth temperature of each layer, in the case of using p-type GaP as the strain adjustment layer 13, a temperature in the range of 720° C. to 770° C. can be applied, and in each of the other layers, a temperature in the range of 600° C. to 700° C. can be applied. Further, the carrier concentration and the layer thickness of each layer and a temperature condition can be appropriately selected.

In the compound semiconductor layer 11 made in this way, an excellent surface state in which crystal defects are few can be obtained even if the compound semiconductor layer 11 includes the strained light-emitting layer 31.

Then, the surface 13a of the strain adjustment layer 13 wherein the surface is on the opposite side with respect to the semiconductor substrate 33 is polished down to a depth of 1 μm from the surface, and then the roughness of the surface is, for example, within 0.18 nm.

Figure 6:
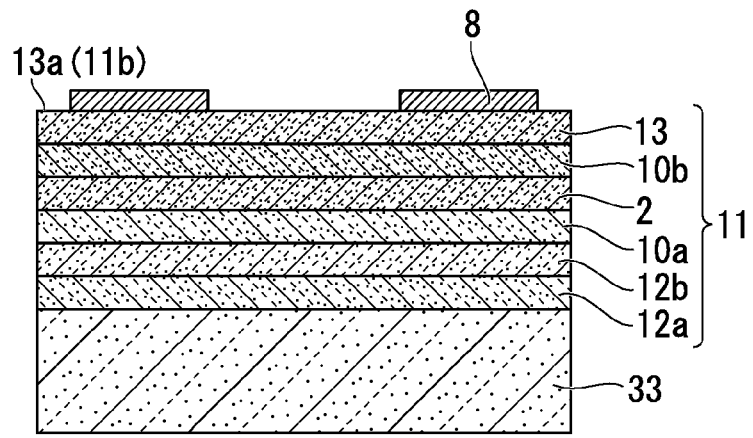
FIG. 6 is a cross-sectional view (3) showing a manufacturing process of a light-emitting diode according to the first embodiment of the present invention.

Next, as shown in FIG. 6, the second electrode 8 (ohmic electrode) is formed on the surface 13a of the strain adjustment layer 13. For example, the second electrode 8 is formed by laminating the Au layer having a thickness of 0.2 μm on a AuBe layer having a thickness of 0.4 μm. For example, the second electrodes 8 with a circular shape of 20 μmφ in planar view are formed at intervals of 60 nm.

<Process of Forming Reflective Structure>

Figure 7:
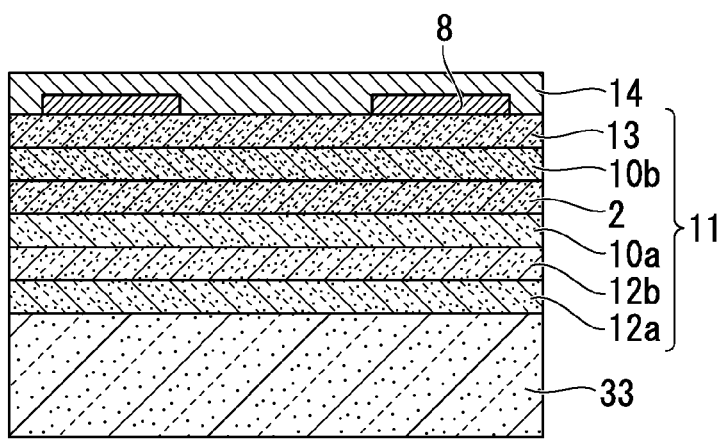
FIG. 7 is a cross-sectional view (4) showing a manufacturing process of a light-emitting diode according to the first embodiment of the present invention.

Next, as shown in FIG. 7, a transparent conductive layer 14 is formed, which is made of an ITO layer so as to cover a second electrode 8 and the surface 13a of the strain adjustment layer 13, the surface 13a being on the opposite side with respect to the semiconductor substrate 33. Next, after a heat treatment of 450° C., an ohmic contact between the transparent conductive layer 14 and the second electrode 8 is formed.

Figure 8:
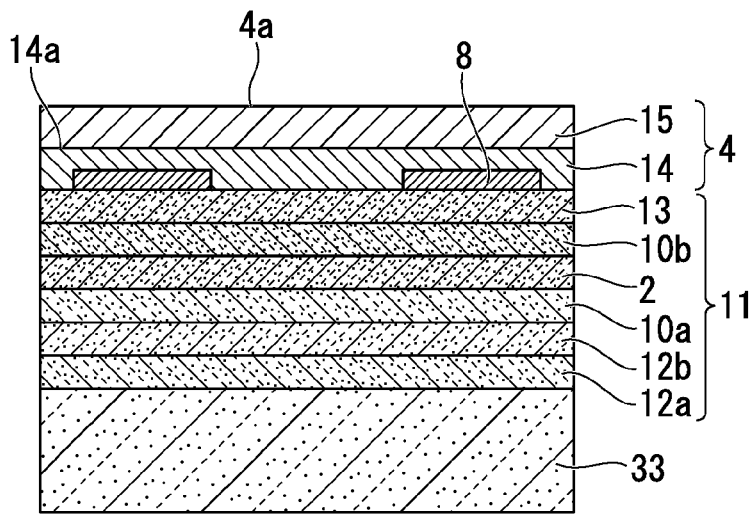
FIG. 8 is a cross-sectional view (5) showing a manufacturing process of a light-emitting diode according to the first embodiment of the present invention.

Next, as shown in FIG. 8, the reflective layer 15 is formed by using a vapor deposition method on the opposite surface 14a of the transparent conductive layer 14 with respect to the compound semiconductor layer 11.

In particular, the reflective layer 15 is formed by laminating sequentially a layer made of an alloy of silver (Ag) (thickness of 0.5 μm), a layer of tungsten (W) (thickness of 0.1 μm), a layer of platinum (Pt) (thickness of 0.1 μm), a layer of gold (Au) (thickness of 0.5 μm), and a layer made of metal eutectic AuGe (melting point 386° C.) (thickness of 1 μm). Thus, the reflective structure 4 consisting of the transparent conductive layer 14 and the reflective layer 15 is formed.

<Process of Bonding Functional Substrate>

Figure 9:
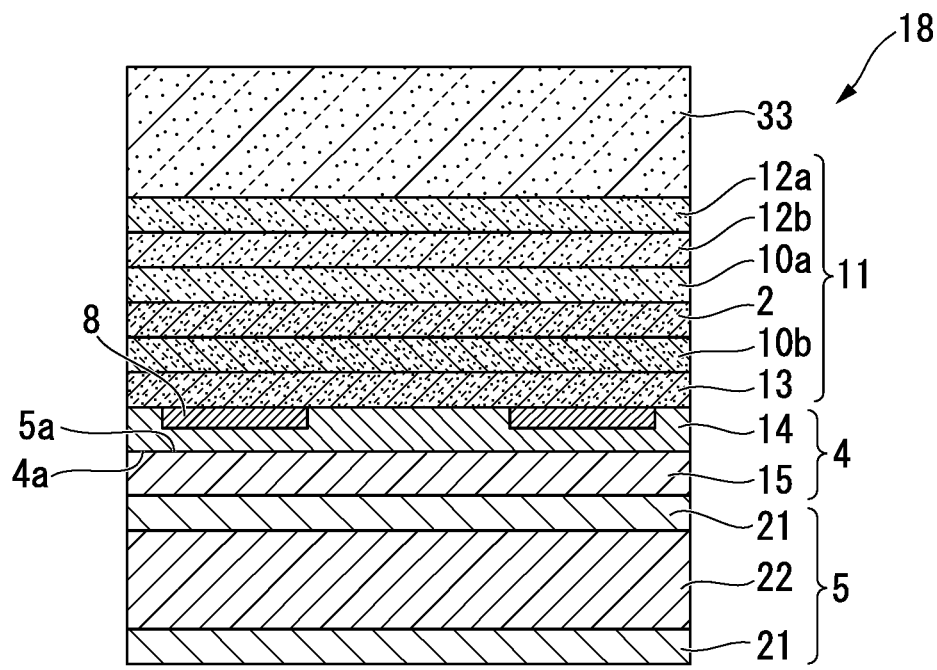
FIG. 9 is a cross-sectional view (6) showing a manufacturing process of a light-emitting diode according to the first embodiment of the present invention.

Next, as shown in FIG. 9, the semiconductor substrate 33 (structure shown in FIG. 8) on which the reflective structure 4 and the compound semiconductor layer 11 are formed, and the functional substrate 5 are placed into a decompression apparatus (not shown). The bonding surface 4a of the reflective structure 4 and the surface 5a of the functional substrate 5 are arranged to overlap and face each other.

Next, after the apparatus is evacuated to $3 \times 10^{-5}$ Pa, while heating the functional substrate 5 and the semiconductor substrate 33 to a temperature of 400° C., the bonding surface 4a of the reflective structure 4 and the bonding surface 5a of the functional substrate 5 are bonded to each other by applying a load of 100 g/cm². In this way, a bonded structure 18 is formed.

<Process of Removing Semiconductor Substrate and Buffer Layer>

Figure 10:
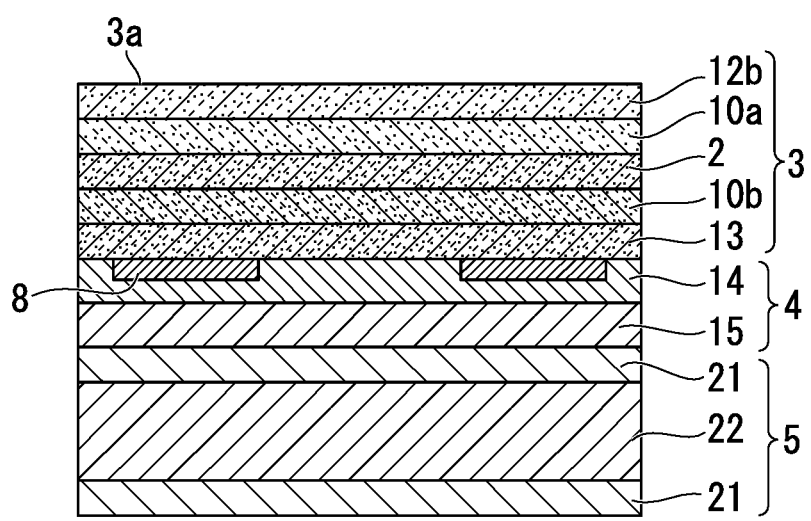
FIG. 10 is a cross-sectional view (7) showing a manufacturing process of a light-emitting diode according to the first embodiment of the present invention.

Next, as shown in FIG. 10, from the bonded structure 18, the semiconductor substrate 33 and buffer layer 12a are selectively removed by the ammonia-based etchant. Thus, a light-emitting section 3 having a light-emitting layer 2 is formed.

<Process to Forming First Electrode>

Then, using a vacuum deposition method, on the surface 3a of the light-emitting section 3 wherein the surface 3a is on the opposite side with respect to the reflection structure 4, a conductive layer for an electrode as a precursor of the first electrode 6 (n-type ohmic electrode) is formed. As examples of the conductive layer for an electrode, a metal multi-layer structure consisting of a AuGe layer, a Ni layer, and a Au layer may be used.

In this case, for example, after a AuGe layer (Ge mass ratio of 12%) with a thickness of 0.15 μm is deposited, a Ni layer with a thickness of 0.05 μm is deposited, and then a Au layer with a thickness of 1 μm is further deposited.

Then, by using a conventional photolithography method, the electrode conductive layer is patterned to a circular shape in planar view, and then the first electrode 6 is formed.

After that, the contact layer 12b is patterned to a shape corresponding to the shape of the first electrode 6, and then the light-emitting diode 1 shown in FIG. 1 is manufactured.

After the electrode conductive layer is patterned, for example, an alloying treatment on each of the metal layers constituting the first electrode 6 is performed for 3 minutes at 420° C., preferably. It is possible to lower the resistance of the first electrode 6 as an n-type ohmic electrode.

Then, after removing the light-emitting section 3 at a cutting portion by etching wherein the light-emitting diode 1 is divided by the cutting portion at the desired size, the substrate and bonding layer at the cutting portion are cut in 0.8 mm pitch by using laser to obtain a light-emitting diode chip (LED chip) having the desired size. For example, the size of the light-emitting diode is set so that the light-emitting section 3 has a substantially rectangular shape in planar view and has a length of the diagonal of the light-emitting section 3 of 1.1 mm.

Thereafter, the exposed surface of the light-emitting section 3 is protected by using the adhesive sheet, and the cut surface is washed <Light-Emitting Diode Lamp>

Figure 11:
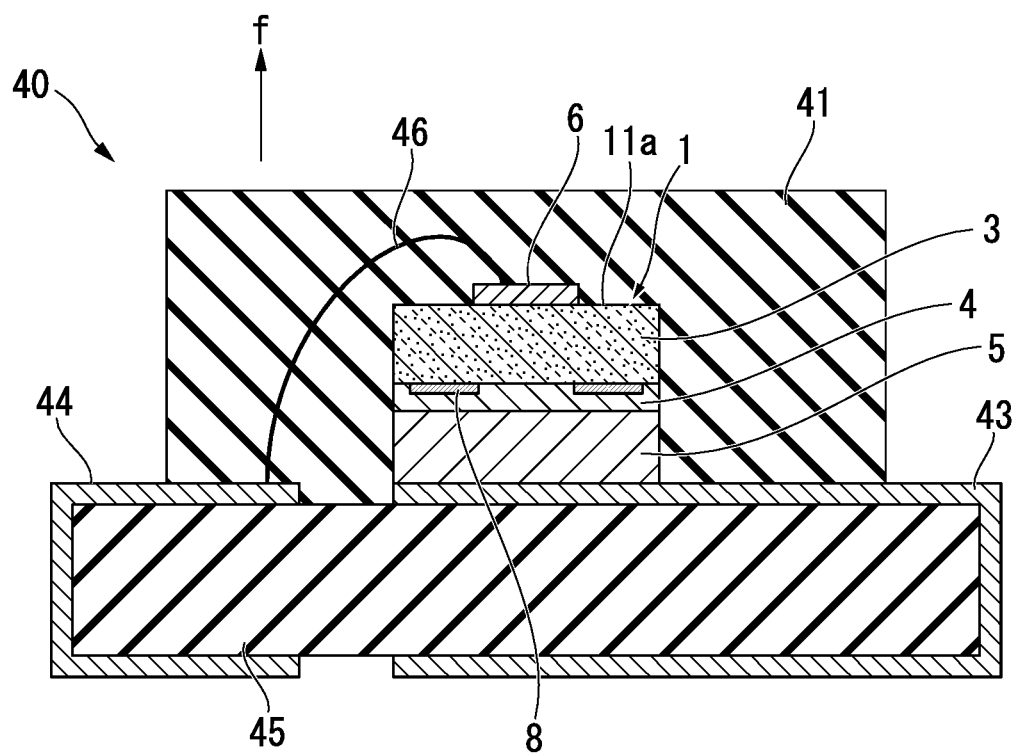
FIG. 11 is a schematic cross-sectional view of a light-emitting diode lamp having the light-emitting diode shown in FIG. 1.

FIG. 11 is a schematic cross-sectional view of a light-emitting diode lamp having a light-emitting diode. In FIG. 11, the elements which are the same as the light-emitting diode 1 shown in FIG. 1 use the same reference numerals.

Referring to FIG. 11, the light-emitting diode lamp 40 of the first embodiment includes a package substrate 45; two electrode terminals 43 and 44 formed on the package substrate 45; the light-emitting diode 1 mounted on the electrode terminal 43; and the sealing resin 41 which has an optical transparency, which is made from silicone or the like, and which is formed so as to cover the light-emitting diode 1.

As described above, the light-emitting diode 1 includes the light-emitting section 3, the reflecting structure 4, the functional substrate 5, the first electrode 6, and the second electrode 8, the function substrate 5 being arranged so as to be connected with the electrode terminal 43.

In addition, the first electrode 6 is connected by wire bonding with the electrode terminal 44. In the light-emitting diode 1 described above, the voltage applied to the electrode terminals 43 and 44 is applied to the light-emitting section 3 through the first electrode 6 and the second electrode 8, and then the light-emitting layer 2 of the light-emitting section 3 emits light. The emitted light is extracted in f direction through the light extraction surface 11a of the light-emitting diode 1

The thermal resistance of the package substrate 45 is 10° C./W or less. Even when light is emitted by adding a power of 1 W or more to the light-emitting layer 2, the package substrate 45 can be used as a substrate for heat dissipation, and as a result, the heat dissipation of the light-emitting diode 1 is further enhanced.

The shape of the package substrate 45 is not limited to the shape shown in FIG. 11. It may be other shapes. In the LED lamp products using other shapes of package substrate, since it is possible to ensure sufficient heat dissipation, a light-emitting diode lamp having a high output and high-brightness can be obtained.

According to the light-emitting diode lamp of the first embodiment, which include the light-emitting diode 1, since the light-emitting diode 1 includes the reflective structure 4 which is provided on the surface 11b of the compound semiconductor layer 11 wherein the surface 11b is located on the opposite side with respect to the light extraction surface 11a, it is possible that the ratio between the irradiance in a direction forming an angle of 90° with respect to the light extraction surface and the irradiance in a direction forming an angle of 45° with respect to the light extraction surface is greater than 1.0 times. The light-emitting diode lamp 40 having high brightness and high efficiency can be obtained.

Further, by connecting the functional substrate 5 constituting the light-emitting diode 1 and the electrode terminal 43 formed on the package substrate 45 that serves as a substrate for heat dissipation, heat generated by the light-emitting diode 1 can be efficiently dissipated through the package substrate 45 and the electrode terminals 43.

Further, by providing the package substrate 45 having a thermal resistance of 10° C./W or less, the light-emitting diode lamp 40 which is excellent in heat dissipation and which emits light with high brightness using a high voltage can be obtained.

In addition, since the light-emitting diode lamp 40 has a configuration able to emit light by applying power of 1 W or more to the light-emitting layer 2 of the light-emitting diode 1, the light-emitting diode lamp 40 is excellent in heat dissipation, and is able to emit light with high brightness using a high voltage.

Second Embodiment

Figure 12A:
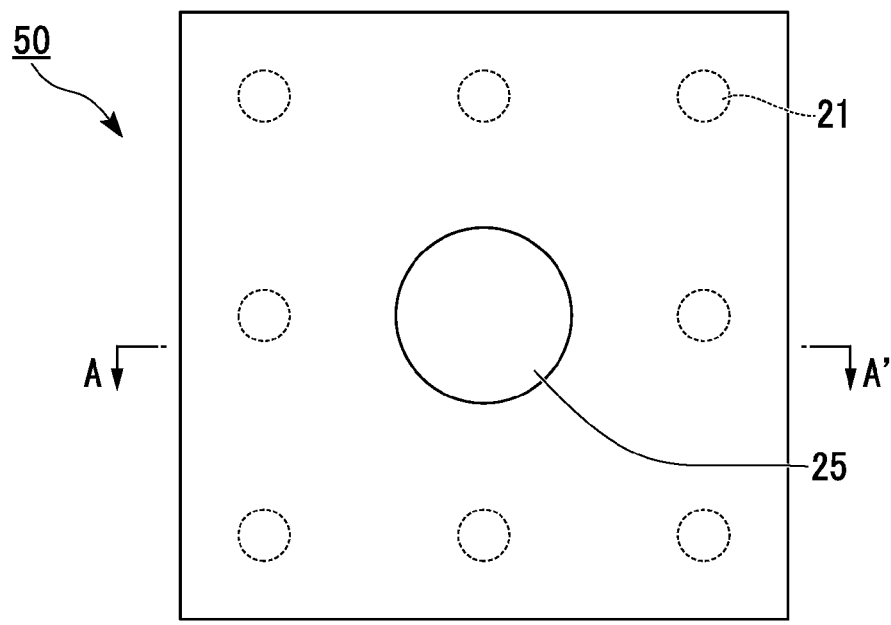
FIG. 12A is a plan view showing a light-emitting diode according to a second embodiment of the present invention.
Figure 12B:
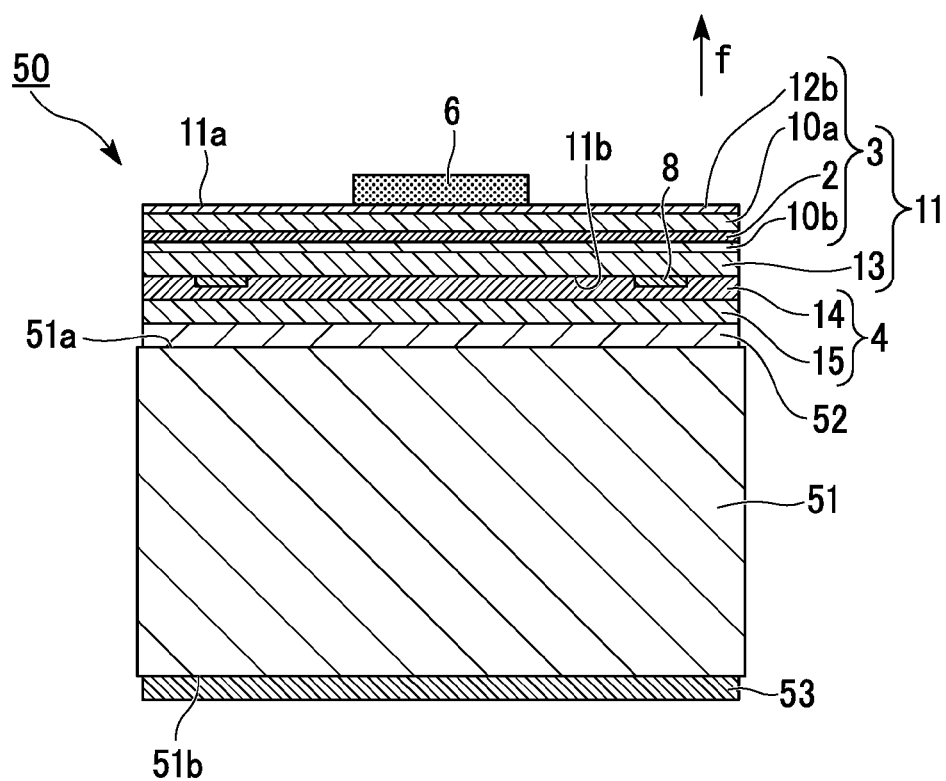
FIG. 12B is a schematic cross-sectional view of a light-emitting diode according to a second embodiment of the present invention along the line A-A' of the light-emitting diode shown in FIG. 12A.

FIGS. 12A and 12B are diagrams showing a light-emitting diode according to the second embodiment of the present invention. FIG. 12A is a plan view of a light-emitting diode of the second embodiment. FIG. 12B is a schematic cross-sectional view along the line A-A' of the light-emitting diode shown in FIG. 12A.

Referring to FIGS. 12A and 12B, a light-emitting diode 50 of the second embodiment has the same elements as the light-emitting diode 1 of the first embodiment except that instead of the functional substrate 5 (metal substrate) provided in the light-emitting diode 1 of the first embodiment, a light-emitting diode 50 of the second embodiment includes a functional substrate 51 made of a material different from the functional substrate 5, as well as metal layers 52 and 53, and contact layer 12b provided to cover the upper surface of the upper clad layer 10a.

In other words, the major difference between the light-emitting diode 1 of the first embodiment and the light-emitting diode 50 of the second embodiment is that the materials of the functional substrates are different.

The functional substrate 51 is bonded through the metal layer 52 with the reflective structure 4 provided on the compound semiconductor layer 11 (more specifically, the reflective layer 15). As the material of the functional substrate 51, any one of GaP, Si, or Ge may be used.

By providing the functional substrate 51 made of any one of materials GaP, Si, or Ge, compared with a light-emitting diode without a functional substrate 51, the light-emitting section 3 is able to efficiently dissipate heat to the outside of the light-emitting diodes 50 while emitting light.

In addition, since materials, such as Si or Ge, having resistant to corrosion are used as the material of the functional substrate 51, the moisture resistance of functional substrate 51 can be improved.

The metal layer 52 is provided between the upper surface 51a of the functional substrate 51 and the reflective layer 15 constituting the reflective structure 4. The metal layer 52 is provided for bonding the upper surface 51a of the functional substrate 51 and the reflective layer 15. As examples of the metal layer 52, the laminated layer sequentially stacked In layer, Au layer, and Ti layer may be used.

The metal layer 53 is provided on the lower surface 51b of the functional substrate 51. As examples of the metal layer 53, a laminated layer sequentially stacked Au layer and, Ti layer may be used.

According to the light-emitting diode of the second embodiment, since the light-emitting diode includes the functional substrate 51 which is bonded through the metal layer 52 to the reflective structure 4 on which the compound semiconductor layer 11 is provided and which is composed of any one of materials of GaP, Si, or Ge, compared with the light-emitting diode without the functional substrate 51, heat generated by the light-emitting section 3 while emitting is able to be dissipated more efficiently outside of the light-emitting diodes 50.

In addition, by using a material, such as Si or Ge, which is resistant to corrosion as the material of the functional substrate 51, the moisture resistance of the functional substrate 51 can be improved.

In addition, since the reflective structure 4 is provided on the surface 11b of the compound semiconductor layer 11, the surface 11b being located on the opposite side with respect to the light extraction surface 11a, it is possible that in the light emitted from a light extraction surface 11a of the compound semiconductor layer 11, the intensity of the light traveling in a direction (specifically, the front direction f) perpendicular to the light extraction surface 11a increases. Therefore, a light-emitting diode 50 having high brightness and high efficiency can be obtained.

In addition, since the light-emitting diode 50 of the second embodiment includes the light-emitting section 3 which are made of a buffer layer 32 and a strained light-emitting layer 31 having a composition formula $(Al_XGa_{1-X})_YIn_{1-Y}P$ ($0 \leq X \leq 0.1, 0.37 \leq Y \leq 0.46$), the efficiency and response time of light emitted from the light-emitting section 3 can be improved.

Further, by defining the above-mentioned range of the composition of the strained light-emitting layer 31, a light-emitting diode 50 having an emission wavelength of 655 nm and more can be obtained.

Further, since the strain adjustment layer 13 that can transmit light of the light-emitting section 3 is provided on the light-emitting section 3, light from the light-emitting section 3 cannot be absorbed by the strain adjustment layer, and a light-emitting diode 50 with high efficiency and high power can be obtained.

In addition, since the strain adjustment layer 13 has a lattice constant smaller than the lattice constant of the strained light-emitting layer 31 the barrier layer 32, the occurrence of warp of the semiconductor compound layer 11 can be suppressed. Therefore, the variation in the amount of strain of the strained light-emitting layer 31 is reduced, and as a result, a light-emitting diode 50 with excellent monochromatic can be obtained.

EXAMPLES

Hereinafter, the effects of the invention will be specifically described using Examples. However, the invention is not limited to these Examples.

In accordance with the Examples, an example of producing a light-emitting diode of the present invention is described concretely. After the light-emitting diode was obtained, for characteristic evaluation, a light-emitting diode lamp in which a light-emitting diode chip is mounted on a substrate was manufactured.

Example 1

In a light-emitting diode of Example 1 (the first embodiment), an epitaxial wafer was prepared by sequentially stacking compound semiconductor layers on top of a semiconductor substrate composed of monocrystalline Si-doped n-type GaAs (thickness of about 0.5 μm). In the GaAs substrate, the growth plane was inclined 15° from the (100) plane towards the (0-1-1) direction, and the carrier concentration was $2 \times 10^{18}$ cm$^{-3}$.

The compound semiconductor layers were prepared, on the GaAs substrate, by sequentially stacking an n-type buffer layer made of Si-doped GaAs, an n-type contact layer made of Si-doped $(Al_{0.7}Ga_{0.3})_{0.5}In_{0.5}P$, an n-type upper clad layer made of Si-doped $(Al_{0.7}Ga_{0.3})_{0.5}In_{0.5}P$, a strained light-emitting layer/barrier layer composed of pairs of undoped $Ga_{0.44}In_{0.56}P/(Al_{0.53}Ga_{0.47})_{0.5}In_{0.5}P$, a p-type lower clad layer made of Mg-doped $(Al_{0.7}Ga_{0.3})_{0.5}In_{0.5}P$, a thin-layer intermediate layer made of $(Al_{0.5}Ga_{0.5})_{0.5}In_{0.5}P$, and a strain adjustment layer made of Mg-doped p-type GaP.

In Example 1, a reduced-pressure metal organic chemical vapor deposition apparatus (MOCVD apparatus) was used, and epitaxial wafers were formed by epitaxial growth of compound semiconductor layers on GaAs substrates having a diameter of 76 mm and a thickness of 350 μm.

When making epitaxial growth layers grow, as a raw material of a group III constituent element, trimethylaluminum (($CH_3$)$_3$Al), trimethylgallium (($CH_3$)$_3$Ga), and trimethylindium (($CH_3$)$_3$In) were used. Further, bis(cyclopentadienyl) magnesium (bis-($C_5H_5$)$_2$Mg) was used as the Mg doping material. Disilane ($Si_2H_6$) was used as the Si doping material.

Moreover, phosphine ($PH_3$) and Arsine ($AsH_3$) were used as the raw materials for the group V elements. In terms of the growing temperature used for each of the layers, growth of the strain adjustment layer composed of p-type GaP was performed at 750° C., and each of the other layers was grown at 700° C.

In the buffer layer made of GaAs, a carrier concentration was set to be about $2 \times 10^{18}$ cm$^{-3}$ and the layer thickness was set to be about 0.5 µm. In the contact layer, the carrier concentration was set to be about $2 \times 10^{18}$ cm$^{-3}$ and the layer thickness was set to be about 3.5 µm. In the upper clad layer, the carrier concentration was set to be about $1 \times 10^{18}$ cm$^{-3}$ and the layer thickness was set to be about 0.5 µm.

In Example 1, the strained light-emitting layer was composed of 23 layers of undoped $Ga_{0.44}In_{0.56}P$ with a single layer thickness of approximately 17 nm, and the barrier layer was composed of 22 layers of undoped $(Al_{0.53}Ga_{0.47})_{0.5}In_{0.5}P$ with a single layer thickness of approximately 19 nm.

In the lower clad layer, the carrier concentration was set to be about $8 \times 10^{17}$ cm$^{-3}$ and the layer thickness was set to be about 0.5 µm. In the intermediate layer, the carrier concentration was set to be about $8 \times 10^{17}$ cm$^{-3}$ and the layer thickness was set to be about 0.05 µm.

In the strain adjustment layer made of GaP, the carrier concentration was set to be about $3 \times 10^{18}$ cm$^{-3}$ and the layer thickness was set to be about 9 µm.

Next, the strain adjustment layer was mirror-finished by polishing it until a region 1 µm from the surface was reached. As a result of mirror-finishing, the roughness of the surface was made to be 0.18 nm.

Then, on the strain adjustment layer, a AuBe layer (100 nm thickness) and a Au layer (150 nm thickness) were sequentially deposited to form a laminated layer AuBe/Au, then patterning of AuBe/Au layer was performed by conventional photolithography and etching techniques, and the second electrode was formed.

Then, on the strain adjustment layer, a reflective structure was formed by sequentially laminating ITO layer (300 nm thickness) as a transparent conductive layer covering the second electrode layer and a laminated layer including a Ag alloy layer (500 nm thickness), a W layer (100 nm thickness), a Pt layer (200 nm thickness), a Au layer (500 nm thickness), and a AuGe layer (thickness 1000 nm) as the reflective layer.

Then, by using the method described in the first embodiment, a functional substrate (metal substrate (thermal conductivity of 250 W/mK)) consisting of a three-layer structure (thickness 85 µm) of Cu (30 µm)/Mo (25 µm)/Cu (30 µm) was produced.

The thermal expansion coefficient of the functional substrate of Example 1 was 6.1 ppm/K, and the thermal conductivity thereof was 250 W/m·K. The diameter of the functional substrate was 76 mm, and the thickness was 250 µm.

Next, in the apparatus which was evacuated until a vacuum of $3 \times 10^{-5}$ Pa was reached, the GaAs substrate and the functional substrate were heated 400° C., the reflective structure and the functional substrate were then bonded to each other, and a load was then applied thereto such that pressure on each surface became 100 g/cm$^2$. In this way, a bonded structure was formed.

Next, the GaAs substrate and the GaAs buffer layer were selectively removed from the bonded wafer by an ammonia-based etchant. Next, a Au—Ge—Ni alloy layer having a thickness of 0.5 µm, a Pt layer having a thickness of 0.2 µm and a Au layer having a thickness of 1 µm were formed sequentially on the surface of the contact layer using a vacuum deposition method.

Thereafter, an n-type ohmic electrode, as a first electrode, was formed by patterning the Au—Ge—Ni alloy layer, a Pt layer and a Au layer with the use of general photolithography means. Then, the contact layer having a shape corresponding to the shape of the first electrode was patterned using a general photolithography means.

Next, the main light extraction surface, which was obtained by removing the GaAs substrate, was then rough treated.

Thereafter, the low-resistance first and second electrodes (p-type and n-type ohmic electrodes) were formed by alloying using a thermal treatment at 450° C. for 10 minutes.

Next, a dicing saw was used to cut the bonded structure in which the first and second electrodes were formed. Thus, a light-emitting diode of Example 1 was obtained.

One hundred of the light-emitting diode lamps, on a mount substrate of which the light-emitting diode chips of Example 1 manufactured as described above were mounted, were assembled. The light-emitting diode lamp was produced by keeping a mount substrate by a die-bonder (mount), wire-bonding a n-type ohmic electrode of the light-emitting diode and an n-electrode terminal of the mount substrate by a gold wire, wire-bonding the p-type ohmic electrode to a p-electrode terminal by a gold wire, and then performing sealing with a general epoxy resin.

The elements of the light-emitting diode of Example 1 were shown in Table 1 and the evaluation results of the characteristics of the light-emitting diode lamp in which the light-emitting diode of Example 1 was mounted, were shown in Table 2.

As shown in Table 2, when electric current flowed between the n-type and p-type ohmic electrodes, red light having a peak wavelength of 661.2 nm (greater than 655 nm) was emitted.

A forward voltage ($V_f$) was about 2.1V, because of a low resistance in the bonded interface between the strain adjustment layer constituting the compound semiconductor layer and the functional substrate, and because of excellent ohmic characteristics of each ohmic electrode when electric current of 20 mA flowed in a forward direction.

A light output power when a forward current was set to be 20 mA was 4.1 mW (more than 3 mW). Good results were obtained.

Variability in the peak emission wavelength of all the assembled light-emitting diodes was 2.1 nm (max-min), and good results were obtained. In addition, the variability of the peak emission wavelength (max-min) may be 3 nm or less.

In addition, the response time of the rise of light emission (Tr) was 72 ns, which was lower than 100 ns, and good results were obtained. In addition, in the inspection of surface defects, no surface defects were observed.

In addition, the irradiance ratio (E/F) between the irradiance (E) in a direction forming an angle of 90° with respect to the light extraction surface and the irradiance (F) in a direction forming an angle of 45° with respect to the light extraction surface was 1.43 (greater than 1.0). It was confirmed that the irradiance (E) in a direction forming an angle of 90° with respect to the light extraction surface became stronger.

Further, since the heat dissipation effect of the functional substrate, when the light-emitting diode of Example 1 emitted light, a decrease of the luminous efficiency due to an increase in temperature was not observed.

Figure 13:
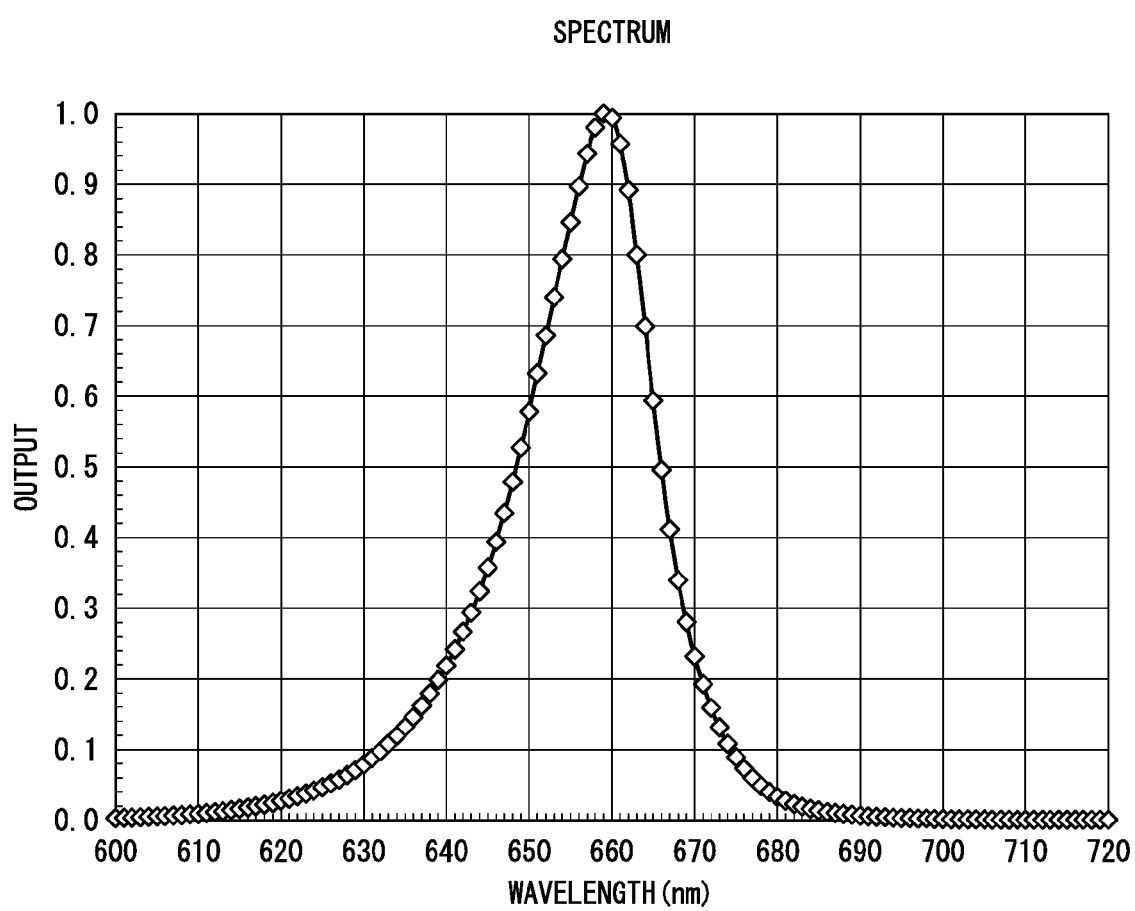
FIG. 13 is a diagram showing the emission spectrum of the LED lamp of the first embodiment of the present invention.

FIG. 13 is a diagram showing the emission spectrum of the light-emitting diode lamp of the first embodiment of the present invention.

As shown in FIG. 13, since full width at half maximum of the emission spectrum of the light-emitting diode lamp of Example 1 was 18 nm, the emission intensity at a 700 nm wavelength was substantially zero.

From the above results, according to the light-emitting diode lamp and the light-emitting diode of Example 1, since a light-emitting layer which was able to emit light having an emission wavelength of 655 nm or more was formed, and a response time (in this case, 72 ns) of less than 100 ns was achieved, it was confirmed that a light-emitting diode having high luminance and high efficiency was obtained.

Further, according to the light-emitting diode and light-emitting diode lamp of Example 1, since the irradiance ratio (=E/F) was 1.43 (greater than 1.0), it was confirmed that a light emission diode having high brightness and high efficiency was able to be obtained.

Furthermore, since the functional substrate had a heat dissipation effect, it was confirmed that a light-emitting diode with excellent heat dissipation property was able to be obtained.

Example 2

The light-emitting diode of Example 2 (the second embodiment) was produced under the same conditions as Example 1, except that a light-emitting layer which was formed by alternately stacking 21 layers of strained light-emitting layers (a single layer thickness of 10 nm) made of undoped $Ga_{0.42}In_{0.58}P$ and 20 layers of barrier layers (a single layer thickness of 30 nm) made of undoped $(Al_{0.53}Ga_{0.47})_{0.5}In_{0.5}P$, and a functional substrate made of a GaP layer having a thickness of 150 μm (thermal conductivity of 110 W/mK) were used.

The elements of the light-emitting diode of Example 2 were shown in Table 1 and the evaluation results of the characteristics of the light-emitting diode lamp in which the light-emitting diode of Example 2 was mounted, are shown in Table 2.

As shown in Table 2, when electric current flowed between the n-type and p-type ohmic electrodes, red light having a peak wavelength of 660.7 nm (greater than 655 nm) was emitted.

The forward voltage ($V_f$) was about 2.1V, because of a low resistance in the bonded interface between the strain adjustment layer constituting the compound semiconductor layer and the functional substrate, and because of the excellent ohmic characteristics of each ohmic electrode when electric current of 20 mA flowed in a forward direction.

A light output power when a forward current was set to be 20 mA was 3.6 mW (more than 3 mW), and good results were obtained.

Variability in peak emission wavelength of all the assembled light-emitting diodes was 2.3 nm (max-min), and good results were obtained. In addition, the response time of the rise of light emission (Tr) was 70 ns, which was lower than 100 ns, and good results were obtained. In addition, in the inspection of surface defects, no surface defects were observed.

In addition, the irradiance ratio (E/F) between the irradiance (E) 90° from the light extraction surface and the irradiance (F) 45° from the light extraction surface was 1.17 (greater than 1.0). It was confirmed that the irradiance (E) 90° from the light extraction surface increased.

Further, because of the heat dissipation effect of the functional substrate, when the light-emitting diode of Example 2 emitted light, a decrease of the luminous efficiency due to an increase in temperature was not observed.

From the above results, according to the light-emitting diode lamp and the light-emitting diode of Example 2, since a light-emitting layer which was able to emit light having an emission wavelength of 655 nm or more was formed, and a response time (in this case, 70 ns) of less than 100 ns was achieved, it was confirmed that a light-emitting diode having high luminance and high efficiency was obtained.

Further, according to the light-emitting diode and light-emitting diode lamp of Example 2, since the irradiance ratio (=E/F) was 1.17 (greater than 1.0), it was confirmed that a light emission diode having high brightness and high efficiency was able to be obtained.

Furthermore, since the functional substrate had a heat dissipation effect, it was confirmed that a light-emitting diode with excellent heat dissipation property was able to be obtained.

Example 3

The light-emitting diode of Example 3 (the second embodiment) was produced under the same conditions as that of Example 2, except that instead of the strained light-emitting layers of Example 2, 21 layers of the strained light-emitting layer (a single layer thickness of 15 nm) made of undoped $Ga_{0.41}In_{0.59}P$ were formed, and a functional substrate made of Ge layer having a thickness of 100 μm (thermal conductivity of 60 W/mK) were used.

The elements of the light-emitting diode of Example 3 are shown in Table 1 and the evaluation results of the characteristics of the light-emitting diode lamp in which the light-emitting diode of Example 3 was mounted, are shown in Table 2.

As shown in Table 2, when electric current flowed between the n-type and p-type ohmic electrodes, red light having a peak wavelength of 668.5 nm (greater than 655 nm) was emitted.

A forward voltage ($V_f$) was about 2.1V, because of a low resistance in the bonded interface between the strain adjustment layer constituting the compound semiconductor layer and the functional substrate, and the excellent ohmic characteristics of each ohmic electrode when electric current of 20 mA flowed in a forward direction.

A light output power when a forward current was set to be 20 mA was 3.7 mW (more than 3 mW), and good results were obtained.

Variability in peak emission wavelength of all the assembled light-emitting diodes was 2.5 nm (max-min), and good results were obtained. In addition, the response time of the rise of light emission (Tr) was 73 ns, which was lower than 100 ns, and good results were obtained. In addition, in the inspection of surface defects, no surface defects were observed.

In addition, the irradiance ratio (E/F) between the irradiance (E) in a direction forming an angle of 90° with respect to the light extraction surface and the irradiance (F) in a direction forming an angle of 45° with respect to the light extraction surface was 1.22 (greater than 1.0). It was confirmed that the irradiance (E) in a direction forming an angle of 90° with respect to the light extraction surface became stronger.

Further, because of the heat dissipation effects of the functional substrate, when the light-emitting diode of Example 3 emitted light, the decrease in the luminous efficiency due to an increase in temperature was not observed.

From the above results, according to the light-emitting diode lamp and the light-emitting diode of Example 3, since a light-emitting layer which was able to emit light having an emission wavelength of 655 nm or more was formed, and a response time (in this case, 73 ns) of less than 100 ns was achieved, it was confirmed that a light-emitting diode having high luminance and high efficiency was obtained.

Further, according to the light-emitting diode and the light-emitting diode lamp of Example 1, since the irradiance ratio (=E/F) was 1.22 (greater than 1.0), it was confirmed that a light emission diode having high brightness and high efficiency was able to be obtained.

Furthermore, since the functional substrate had heat dissipation effect, it was confirmed that a light-emitting diode with excellent heat dissipation property was able to be obtained.

Example 4

The light-emitting diode of Example 4 (the second embodiment) was produced under the same condition as that of Example 2, except that instead of the strained light-emitting layers of Example 2, 21 layers of the strained light-emitting layer (a single layer thickness of 25 nm) made of undoped $Ga_{0.45}In_{0.55}P$ was formed and a functional substrate made of a Si layer having a thickness of 100 µm (thermal conductivity of 126 W/mK) was used.

The elements of the light-emitting diode of Example 4 were shown in Table 1 and the evaluation results of the characteristics of the light-emitting diode lamp in which the light-emitting diode of Example 4 was mounted, are shown in Table 2.

As shown in Table 2, when electric current flowed between the n-type and p-type ohmic electrodes, red light having a peak wavelength of 657.0 nm (greater than 655 nm) was emitted.

A forward voltage ($V_f$) was about 2.1V, because of a low resistance in the bonded interface between the strain adjustment layer constituting the compound semiconductor layer and the functional substrate, and the excellent ohmic characteristics of each ohmic electrode when electric current of 20 mA flowed in a forward direction.

A light output power when a forward current was set to be 20 mA was 4.0 mW (more than 3 mW), and good results were obtained.

Variability in peak emission wavelength of all the assembled light-emitting diodes was 2.1 nm (max-min), and good results were obtained. In addition, the response time of the rise of light emission (Tr) was 64 ns, which was lower than 100 ns, and good results were obtained. In addition, in the inspection of surface defects, no surface defects were observed.

In addition, the irradiance ratio (E/F) between the irradiance (E) in a direction forming an angle of 90° with respect to the light extraction surface and the irradiance (F) in a direction forming an angle of 45° with respect to the light extraction surface was 1.33 (greater than 1.0). It was confirmed that the irradiance (E) in a direction forming an angle of 90° with respect to the light extraction surface became stronger.

Further, because of the heat dissipation effects of the functional substrate, when the light-emitting diode of Example 4 emitted light, a decrease of the luminous efficiency due to an increase in temperature was not observed.

From the above results, according to the light-emitting diode lamp and the light-emitting diode of Example 4, since a light-emitting layer which was able to emit light having an emission wavelength of 655 nm or more was formed, and a response time (in this case, 64 ns) of less than 100 ns was achieved, it was confirmed that a light-emitting diode having high luminance and high efficiency was obtained.

Further, according to the light-emitting diode and light-emitting diode lamp of Example 4, since the irradiance ratio (=E/F) was 1.33 (greater than 1.0), it was confirmed that a light emission diode having high brightness and high efficiency was able to be obtained.

Furthermore, since the functional substrate had heat dissipation effect, it was confirmed that a light-emitting diode with excellent heat dissipation property was able to be obtained.

Example 5

The light-emitting diode of Example 5 (the first embodiment) was produced under the same conditions as that of Example 2, except that instead of the composition of the strained light-emitting layers of Example 2, $Ga_{0.39}In_{0.61}P$ was used and a functional substrate made of a three-layer structure (thickness of 85 µm) including Cu (30 µm), Mo (25 µm), and Cu (30 µm) (metal substrate (thermal conductivity of 250 W/mK)) were used.

The elements of the light-emitting diode of Example 5 were shown in Table 1 and the evaluation results of the characteristics of the light-emitting diode lamp in which the light-emitting diode of Example 5 was mounted, were shown in Table 2.

As shown in Table 2, when electric current flowed between the n-type and p-type ohmic electrodes, red light having a peak wavelength of 669.8 nm (greater than 655 nm) was emitted.

A forward voltage ($V_f$) was about 2.1V, because of a low resistance in the bonded interface between the strain adjustment layer constituting the compound semiconductor layer and the functional substrate, and the excellent ohmic characteristic of each ohmic electrode when electric current of 20 mA flowed in a forward direction.

A light output power when a forward current was set to be 20 mA was 3.9 mW (more than 3 mW), and good results were obtained.

Variability in the peak emission wavelength of all the assembled light-emitting diodes was 2.9 nm (max-min), and good results were obtained. In addition, the response time of the rise of light emission (Tr) was 63 ns, which was lower than 100 ns, and good results were obtained. In addition, in the inspection of surface defects, no surface defects were observed.

In addition, the irradiance ratio (E/F) between the irradiance (E) in a direction forming an angle of 90° with respect to the light extraction surface and the irradiance (F) in a direction forming an angle of 45° with respect to the light extraction surface was 1.41 (greater than 1.0). It was confirmed that the irradiance (E) in a direction forming an angle of 90° with respect to the light extraction surface became stronger.

Further, because of the heat dissipation effects of the functional substrate, when the light-emitting diode of Example 5 emitted light, a decrease in the luminous efficiency due to an increase in temperature was not observed.

From the above results, according to the light-emitting diode lamp and the light-emitting diode of Example 5, since a light-emitting layer which was able to emit light having an emission wavelength of 655 nm or more was formed, and a response time (in this case, 63 ns) of less than 100 ns was achieved, it was confirmed that a light-emitting diode having high luminance and high efficiency was obtained.

Further, according to the light-emitting diode and light-emitting diode lamp of Example 1, since the irradiance ratio (=E/F) was 1.41 (greater than 1.0), it was confirmed that a light emission diode having high brightness and high efficiency was able to be obtained.

Furthermore, since the functional substrate had a heat dissipation effect, it was confirmed that a light-emitting diode with an excellent heat dissipation property was able to be obtained.

Example 6

The light-emitting diode of Example 6 (the first embodiment) was produced under the same conditions as that of Example 5, except that instead of the composition of the strained light-emitting layers of Example 5, $Ga_{0.38}In_{0.62}P$ was used The elements of the light-emitting diode of Example 6 were shown in Table 1 and the evaluation results of the characteristics of the light-emitting diode lamp in which the light-emitting diode of Example 6 was mounted, were shown in Table 2.

As shown in Table 2, when electric current flowed between the n-type and p-type ohmic electrodes, red light having a peak wavelength of 675.1 nm (greater than 655 nm) was emitted.

A forward voltage ($V_f$) was about 2.1V, because of a low resistance in the bonded interface between the strain adjustment layer constituting the compound semiconductor layer and the functional substrate, and the excellent ohmic characteristic of each ohmic electrode when electric current of 20 mA flowed in a forward direction.

The light output power when a forward current was set to be 20 mA was 3.6 mW (more than 3 mW), and good results were obtained.

Variability in peak emission wavelength of all the assembled light-emitting diodes was 2.9 nm (max-min), and good results were obtained. In addition, the response time of the rise of light emission (Tr) was 65 ns, which was lower than 100 ns, and good results were obtained. In addition, in the inspection of surface defects, no surface defects were observed.

In addition, the irradiance ratio (E/F) between the irradiance (E) in a direction forming an angle of 90° with respect to the light extraction surface and the irradiance (F) in a direction forming an angle of 45° with respect to the light extraction surface was 1.36 (greater than 1.0). It was confirmed that the irradiance (E) in a direction forming an angle of 90° with respect to the light extraction surface became stronger.

Further, because of the heat dissipation effect of the functional substrate, when the light-emitting diode of Example 6 emitted light, a decrease of the luminous efficiency due to an increase in temperature was not observed.

From the above results, according to the light-emitting diode lamp and the light-emitting diode of Example 6, since a light-emitting layer which was able to emit light having an emission wavelength of 655 nm or more was formed, and a response time (in this case, 65 ns) of less than 100 ns was achieved, it was confirmed that a light-emitting diode having high luminance and high efficiency was obtained.

Further, according to the light-emitting diode and light-emitting diode lamp of Example 6, since the irradiance ratio (=E/F) was 1.36 (greater than 1.0), it was confirmed that a light emission diode having high brightness and high efficiency was able to be obtained.

Furthermore, since the functional substrate had a heat dissipation effect, it was confirmed that a light-emitting diode with excellent heat dissipation properties was able to be obtained.

Reference Example 1

The light-emitting diode of Reference Example 1 was produced under the same conditions as that of Example 2, except that the reflective structure was removed from the elements of the light-emitting diode of Example 2, and instead of the strained light-emitting layer provided in the light-emitting diode of Example 2, 21 layers of strained light-emitting layers (a single layer thickness of 5 nm) made of undoped $Ga_{0.33}In_{0.62}P$ were used. In other words, the light-emitting diode of Reference Example 1 had no reflective structure.

The elements of the light-emitting diode of Reference Example 1 were shown in Table 1 and the evaluation results of the characteristics of the light-emitting diode lamp in which the light-emitting diode of Reference Example 1 was mounted, were shown in Table 2.

As shown in Table 2, when electric current flowed between the n-type and p-type ohmic electrodes, red light having a peak wavelength of 651.5 nm (smaller than 655 nm) was emitted. In other words, the objective of the peak emission wavelength of 655 nm or more was not able to be achieved.

The forward voltage ($V_f$) was about 2.0V, because of the low resistance in the bonded interface between the strain adjustment layer constituting the compound semiconductor layer and the functional substrate, and the excellent ohmic characteristics of each ohmic electrode when electric current of 20 mA flowed in a forward direction.

The light output power when a forward current was set to be 20 mA was 3.1 mW (more than 3 mW), and good results were obtained.

Variability (max-min) in the peak emission wavelength of all the assembled light-emitting diodes was 5.1 nm (greater than 3 nm), and bad results were obtained. In addition, the response time of the rise of light emission (Tr) was 42 ns, which was lower than 100 ns, and good results were obtained. In addition, in the inspection of surface defects, no surface defects were observed.

In addition, the irradiance ratio (E/F) between the irradiance (E) in a direction forming an angle of 90° with respect to the light extraction surface and the irradiance (F) in a direction forming an angle of 45° with respect to the light extraction surface was 0.83 (smaller than 1.0). It was confirmed that the irradiance (E) in a direction forming an angle of 90° with respect to the light extraction surface was weaker than that of the light-emitting diode of Examples 1 to 5 (In other words, the effect of the reflective structure was confirmed).

Further, because of the heat dissipation effect of the functional substrate, when the light-emitting diode of Reference Example 1 emitted light, a decrease of the luminous efficiency due to an increase of temperature was not observed.

From the above results, according to the light-emitting diode lamp and the light-emitting diode of Reference Example 1, the objective regarding the peak emission wavelength, the variability in peak emission wavelength, and the irradiance ratio (=E/F) was not able to be achieved.

Reference Example 2

The light-emitting diode of Reference Example 1 was produced under the same condition as that of Example 2, except that a reflective structure was removed from the elements of the light-emitting diode of Example 2, and the instead of the strained light-emitting layer provided in the light-emitting diode of Example 2, 21 layers of strained light-emitting layers (a single layer thickness of 10 nm) made of undoped $Ga_{0.37}In_{0.63}P$ were used. In other words, the light-emitting diode of Reference Example 2 had no reflective structure.

The elements of the light-emitting diode of Reference Example 2 were shown in Table 1 and the evaluation results of the characteristics of the light-emitting diode lamp in which the light-emitting diode of Reference Example 2 was mounted, were shown in Table 2.

As shown in Table 2, when electric current flowed between the n-type and p-type ohmic electrodes, red light having a peak wavelength of 677.7 nm (greater than 655 nm) was emitted.

The forward voltage ($V_f$) was about 2.3V, because of a low resistance in the bonded interface between the strain adjustment layer constituting the compound semiconductor layer and the functional substrate, and the excellent ohmic characteristic of each ohmic electrode when electric current of 20 mA flowed in a forward direction.

A light output power when a forward current was set to be 20 mA was 1.3 mW (more than 3 mW), and bad results were obtained.

Variability (max-min) in peak emission wavelength of all the assembled light-emitting diodes was 3.8 nm (greater than 3 nm), and bad results were obtained. In addition, the response time of the rise of light emission (Tr) was 45 ns, which was lower than 100 ns, and good results were obtained. In addition, in the inspection of surface defects, surface defects were observed.

In addition, the irradiance ratio (E/F) between the irradiance (F) in a direction forming an angle of 90° with respect to the light extraction surface and the irradiance (F) in a direction forming an angle of 45° with respect to the light extraction surface was 0.76 (smaller than 1.0). It was confirmed that the irradiance (E) in a direction forming an angle of 90° with respect to the light extraction surface was weaker than that of the light-emitting diode of Examples 1 to 5.

Further, because of the heat dissipation effect of the functional substrate, when the light-emitting diode of Reference Example 2 emitted light, a decrease of the luminous efficiency due to an increase in temperature was not observed.

From the above results, according to the light-emitting diode lamp and the light-emitting diode of Reference Example 2, the objective regarding the objective regarding the light output power when the forward current was set to be 20 mA, the variability in peak emission wavelength, surface defects, and the irradiance ratio (=E/F) was not able to be achieved.

Reference Example 3

The light-emitting diode of Reference Example 3 was produced under the same condition as that of Example 2, except that the reflective structure was removed from the elements of the light-emitting diode of Example 2, and instead of the strained light-emitting layer provided in the light-emitting diode of Example 2, 23 layers of strained light-emitting layers (a single layer thickness of 17 nm) made of undoped $Ga_{0.48}In_{0.52}P$ were used and the thickness of the barrier layer was changed to 19 nm and the number of barrier layers was changed to 22 layers. In other words, the light-emitting diode of Reference Example 3 had no reflective structure.

The elements of the light-emitting diode of Reference Example 3 were shown in Table 1 and the evaluation results of the characteristics of the light-emitting diode lamp in which the light-emitting diode of Reference Example 3 was mounted, were shown in Table 2.

As shown in Table 2, when electric current flowed between the n-type and p-type ohmic electrodes, red light having a peak wavelength of 647.7 nm (smaller than 655 nm) was emitted. In other words, the objective of the peak emission wavelength of 655 nm or more was not able to be achieved.

The forward voltage ($V_f$) was about 2.0V, because of a low resistance in the bonded interface between the strain adjustment layer constituting the compound semiconductor layer and the functional substrate, and an excellent ohmic characteristic of each ohmic electrode when electric current of 20 mA flowed in a forward direction.

A light output power when a forward current was set to be 20 mA was 3.3 mW (more than 3 mW), and good results were obtained.

Variability (max-min) in the peak emission wavelength of all the assembled light-emitting diodes was 2.7 nm (smaller than 3 nm), and good results were obtained. In addition, the response time of the rise of light emission (Tr) was 62 ns, which was lower than 100 ns, and good results were obtained. In addition, in the inspection of surface defects, no surface defects were observed.

In addition, the irradiance ratio (E/F) between the irradiance (E) in a direction forming an angle of 90° with respect to the light extraction surface and the irradiance (F) in a direction forming an angle of 45° with respect to the light extraction surface was 0.80 (smaller than 1.0). It was confirmed that the irradiance (E) in a direction forming an angle of 90° with respect to the light extraction surface was weaker than that of the light-emitting diode of Examples 1 to 5.

Further, because of the heat dissipation effect of the functional substrate, when the light-emitting diode of Reference Example 3 emitted light, a decrease in the luminous efficiency due to an increase of temperature was not observed.

From the above results, according to the light-emitting diode lamp and the light-emitting diode of Reference Example 3, good results regarding the peak emission wavelength, and the irradiance ratio (=E/F) were not able to be achieved.

Reference Example 4

The light-emitting diode of Reference Example 4 was produced under the same conditions as that of Example 2, except that a reflective structure was removed from the elements of the light-emitting diode of Example 2, and instead of a strained light-emitting layer provided in the light-emitting diode of Example 2, 13 layers of strained light-emitting layers (a single layer thickness of 30 nm) made of undoped $Ga_{0.44}In_{0.56}P$ were used, and the number of barrier layers was changed to 12 layers. In other words, the light-emitting diode of Reference Example 4 had no reflective structure.

The elements of the light-emitting diode of Reference Example 4 were shown in Table 1 and the evaluation results of the characteristics of the light-emitting diode lamp in which the light-emitting diode of Reference Example 4 was mounted, are shown in Table 2. In other words, the light-emitting diode of Reference Example 4 had no reflective structure.

As shown in Table 2, when electric current flowed between the n-type and p-type ohmic electrodes, red light having a peak wavelength of 668.9 nm (greater than 655 nm) was emitted.

A forward voltage ($V_f$) was about 2.3V, because of the low resistance in the bonded interface between the strain adjustment layer constituting the compound semiconductor layer and the functional substrate, and the excellent ohmic characteristics of each ohmic electrode when electric current of 20 mA flowed in a forward direction.

A light output power when a forward current was set to be 20 mA was 1.1 mW. The objective of 3 mW or more was not able to be achieved.

Variability (max-min) in peak emission wavelength of all the assembled light-emitting diodes was 4.1 nm. The objective of 3 nm or less was not able to be achieved.

In addition, the response time of the rise of light emission (Tr) was 43 ns, which was lower than 100 ns, and good results were obtained. In addition, in the inspection of surface defects, surface defects were observed.

In addition, the irradiance ratio (E/F) between the irradiance (E) in a direction forming an angle of 90° with respect to the light extraction surface and the irradiance (F) in a direction forming an angle of 45° with respect to the light extraction surface was 0.77 (smaller than 1.0). It was confirmed that the irradiance (E) in a direction forming an angle of 90° with respect to the light extraction surface was weaker than that of the light-emitting diode of Examples 1 to 5.

Further, because of the heat dissipation effect of the functional substrate, when the light-emitting diode of Reference Example 4 emitted light, a decrease of the luminous efficiency due to an increase in temperature was not observed.

From the above results, according to the light-emitting diode lamp and the light-emitting diode of Reference Example 4, the objectives regarding the light output power when a forward current was set to be 20 mA, the variability in peak emission wavelength, surface defects and the irradiance ratio (=E/F) were not able to be achieved.

INDUSTRIAL APPLICABILITY

The light-emitting diode of the present invention may be used in a light-emitting diode for plants growth, and in light-emitting diodes for high-speed couplers which are used for electrical signal transmission in a high-voltage circuit.

DESCRIPTION OF THE REFERENCE SIGNS

1, 50: Light-emitting diode,
2: Light-emitting layer,
3: Light-emitting section,
3a, 3b, 13a, 14a, 15b: Surface,
4: Reflective structure,
4a, 5a: Bonding surface,
5.51: Functional substrate,
5b: Surface,
6: The first electrode,

TABLE 1

| | Elements of Functional substrate | Heat conductivity of Functional substrate (W/mK) | Reflective structure | Strain adjustment layer | Value of X in strained light-emitting layer $Ga_xIn_{1-X}P$ | Strained light-emitting layer thickness (nm) | Number of strained light-emitting layers | Total thickness of strained light-emitting layers | Barrier layer thickness (nm) | Number of barrier layers |
|---|---|---|---|---|---|---|---|---|---|---|
| Example 1 | Cu (30 μm)/Mo (251 μm)/Cu (30 μm) | 250 | Presence | GaP | 0.44 | 17 | 23 | 391 | 19 | 22 |
| Example 2 | GaP(150 μm) | 110 | Presence | GaP | 0.42 | 10 | 21 | 210 | 30 | 20 |
| Example 3 | GaP(100 μm) | 60 | Presence | GaP | 0.41 | 15 | 21 | 315 | 30 | 20 |
| Example 4 | Si(100 μm) | 126 | Presence | GaP | 0.45 | 25 | 21 | 525 | 30 | 20 |
| Example 5 | Cu (30 μm)/Mo (25 μm)/Cu (30 μm) | 250 | Presence | GaP | 0.39 | 10 | 21 | 210 | 30 | 20 |
| Example 6 | Cu (30 μm)/Mo (25 μm)/Cu (30 μm) | 250 | Presence | GaP | 0.38 | 10 | 21 | 210 | 30 | 20 |
| Reference example 1 | GaP(150 μm) | 110 | Absence | GaP | 0.38 | 5 | 21 | 105 | 30 | 20 |
| Reference example 2 | GaP(150 μm) | 110 | Absence | GaP | 0.37 | 10 | 21 | 210 | 30 | 20 |
| Reference example 3 | GaP(150 μm) | 110 | Absence | GaP | 0.48 | 17 | 23 | 391 | 19 | 22 |
| Reference example 4 | GaP(150 μm) | 110 | Absence | GaP | 0.44 | 30 | 13 | 390 | 30 | 12 |

TABLE 2

| | Result of surface inspection | $V_f$ @ 20 mA (V) | Output @ 20 mA (mW) | Peak emission wavelength (nm) | Variability in peak emission wavelength (nm) | Response time Tr (ns) | Irradiances (F) in 45° *1 | Irradiances (E) in 90° *2 | Ratio of Irradiances (E/F) |
|---|---|---|---|---|---|---|---|---|---|
| Example 1 | ○ | 2.1 | 4.1 | 661.2 | 2.1 | 72 | 8530 | 12230 | 1.43 |
| Example 2 | ○ | 2.1 | 3.6 | 660.7 | 2.3 | 70 | 8600 | 10060 | 1.17 |
| Example 3 | ○ | 2.1 | 3.7 | 668.5 | 2.5 | 73 | 8540 | 10430 | 1.22 |
| Example 4 | ○ | 2.1 | 4.0 | 657.0 | 2.1 | 64 | 8470 | 11240 | 1.33 |
| Example 5 | ○ | 2.1 | 3.9 | 669.8 | 2.9 | 63 | 8120 | 11460 | 1.41 |
| Example 6 | ○ | 2.1 | 3.6 | 675.1 | 2.9 | 65 | 7970 | 10800 | 1.36 |
| Reference example 1 | ○ | 2.0 | 3.1 | 651.5 | 5.1 | 42 | 9980 | 8240 | 0.83 |
| Reference example 2 | × | 2.3 | 1.3 | 677.7 | 3.8 | 45 | 4300 | 3250 | 0.76 |
| Reference example 3 | ○ | 2.0 | 3.3 | 647.7 | 2.7 | 62 | 10510 | 8430 | 0.80 |
| Reference example 4 | × | 2.3 | 1.1 | 668.9 | 4.1 | 43 | 3560 | 2750 | 0.77 |

*1: 45° from the light extraction surface
*2: 90° from the light extraction surface 8: The second electrode,
10a: Upper clad layer,
10b: Lower clad layer,
11: Compound semiconductor layer,
11a: Light extraction surface,
12a: Buffer layer,
12b: Contact layer,
13: Strain adjustment layer,
14: Transparent electrode layer,
15: Reflective layer,
18: Bonded structure,
21: The first metal layer,
22: The second metal layer,
31: The strained light-emitting layer,
32: Barrier layer,
33: Semiconductor substrate,
33a: Surface,
40: Light-emitting diode lamp,
41: Sealing resin,
43, 44: Electrode terminal,
45: Package substrate,
51a: Upper surface,
51b: Lower surface,
52, 53: Metal layer,
f: Front direction

The invention claimed is:

1. A light-emitting diode, comprising a compound semiconductor layer which comprises:
   a pn junction-type light-emitting section, and
   a strain adjustment layer laminated on the light-emitting section,
   wherein the light-emitting section has a laminated structure composed of a strained light-emitting layer having a composition formula $(Al_XGa_{1-X})_YIn_{1-Y}P$ ($0 \leq X \leq 0.1$, $0.37 \leq Y \leq 0.46$) and a barrier layer, and the light-emitting section further comprises a clad layer on both of an upper surface and a lower surface of the laminated structure composed of the strained light-emitting layer and the barrier layer, wherein a composition formula of the clad layer is $(Al_XGa_{1-X})_YIn_{1-Y}P$ ($0.5 \leq X \leq 1$, $0.48 \leq Y \leq 0.52$),
   a composition formula of the strain adjustment layer is $(Al_XGa_{1-X})_YIn_{1-Y}P$ ($0 \leq X \leq 1$ and $0.6 \leq Y \leq 1$) and the strain adjustment layer is transparent with respect to the emission wavelength, and has a lattice constant smaller than the lattice constants of the strained light-emitting layer and the barrier layer, and
   a functional substrate is bonded to a surface of the compound semiconductor layer through a reflective structure wherein the surface is located on the opposite side with respect to a light extraction surface.

2. The light-emitting diode according to claim 1, wherein the functional substrate is a metal substrate.

3. The light-emitting diode according to claim 2, wherein the metal substrate is made of a plurality of stacked metal layers.

4. The light-emitting diode according to claim 1, wherein the material of the functional substrate is any one of GaP, Si or Ge.

5. The light-emitting diode according to claim 1, the ratio between an irradiance in a direction forming an angle of 90° with respect to the light extraction surface and an irradiance in a direction forming an angle of 45° with respect to the light extraction surface is at least 1.0 times.

6. The light-emitting diode according to claim 1, wherein the composition formula of the strained light-emitting layer is $Ga_XIn_{1-X}P$ ($0.37 \leq X \leq 0.46$).

7. The light-emitting diode according to claim 1, wherein a thickness of the strained light-emitting layer is within a range of from 8 to 30 nm.

8. The light-emitting diode according to claim 1, wherein the light-emitting section comprises 8 to 40 layers of strained light-emitting layers.

9. The light-emitting diode according to claim 1, wherein the composition formula of the barrier layer is $(Al_XGa_{1-X})_YIn_{1-Y}P$ ($0.3 \leq X \leq 0.7$, $0.48 \leq Y \leq 0.52$).

10. The light-emitting diode according to claim 1, wherein a material of the strain adjustment layer is GaP.

11. The light-emitting diode according to claim 1, wherein a thickness of the strain adjustment layer is within a range of from 0.5 to 20 μm.

12. The light-emitting diode according to claim 1, wherein the light extraction surface comprises a rough surface.

13. The light-emitting diode according to claim 1, which is used for promoting photosynthesis during plant growth, wherein a peak emission wavelength of the strained light-emitting layer is within a range of from 655 to 675 nm.

14. The light-emitting diode according to claim 13, wherein the full width at half maximum of the emission spectrum is within a range of from 10 to 40 nm.

15. The light-emitting diode according to claim 13, wherein light emission intensity of the strained light-emitting layer at an emission wavelength of 700 nm is less than 10% of light emission intensity at the peak emission wavelength.

16. The light-emitting diode according to claim 1, wherein a response time (Tr) of the light-emitting section is 100 ns or less.

17. A light-emitting diode lamp, comprising
   a mounting substrate on which surface electrode terminals are formed, and
   a light-emitting diode according to claim 1,
   wherein the light-emitting diode is mounted on the mounting substrate, and the light-emitting diode is electrically connected to the electrode terminals.

* * * * *